(12) United States Patent
Tamamushi

(10) Patent No.: US 12,719,019 B2
(45) Date of Patent: Aug. 25, 2026

(54) PLASMA PROCESSING METHOD AND PLASMA PROCESSING APPARATUS

(71) Applicant: Tokyo Electron Limited, Tokyo (JP)

(72) Inventor: Gen Tamamushi, Kurokawa-gun (JP)

(73) Assignee: Tokyo Electron Limited, Tokyo (JP)

( * ) Notice: Subject to any disclaimer, the term of this patent is extended or adjusted under 35 U.S.C. 154(b) by 92 days.

(21) Appl. No.: 18/412,218

(22) Filed: Jan. 12, 2024

(65) Prior Publication Data

US 2024/0153742 A1 May 9, 2024

Related U.S. Application Data

(63) Continuation of application No. PCT/JP2022/027139, filed on Jul. 8, 2022.

(30) Foreign Application Priority Data

Jul. 14, 2021 (JP) ................................ 2021-116582

(51) Int. Cl.
*H01J 37/32* (2006.01)
*H05H 1/00* (2006.01)
*H05H 1/46* (2006.01)

(52) U.S. Cl.
CPC .. *H01J 37/32146* (2013.01); *H01J 37/32128* (2013.01); *H01J 37/32165* (2013.01); *H01J 37/32183* (2013.01); *H01J 2237/327* (2013.01); *H01J 2237/334* (2013.01)

(58) Field of Classification Search
CPC ......... H05H 1/46; H05H 2242/24; H05H 1/00
See application file for complete search history.

(56) References Cited

U.S. PATENT DOCUMENTS

2012/0000606 A1* 1/2012 Dorai ................ H01J 37/32412 315/111.21
2017/0229312 A1* 8/2017 Park ...................... H10P 50/242
2018/0261430 A1* 9/2018 Kawasaki ........... H01J 37/3299
2020/0227240 A1* 7/2020 Na .......................... H03H 7/38

FOREIGN PATENT DOCUMENTS

JP 2020-004710 A 1/2020
JP 2020-515001 A 5/2020

OTHER PUBLICATIONS

Patent Cooperation Treaty, International Search Report, Application No. PCT/JP2022/027139, dated Aug. 23, 2022, in 4 pages.

* cited by examiner

*Primary Examiner* — Huy Q Phan
*Assistant Examiner* — Temilade S Rhodes-Vivour
(74) *Attorney, Agent, or Firm* — PROCOPIO, CORY, HARGREAVES & SAVITCH LLP

(57) ABSTRACT

A plasma processing method according to the present disclosure includes disposing a substrate on a substrate support, supplying, into a chamber, a processing gas for processing the substrate, generating, in the chamber, a plasma from the processing gas by using a first RF signal and a second RF signal, and applying a bias signal to the substrate support, and generating the plasma includes superimposing the second RF signal on the first RF signal based on a timing when the bias signal is applied to the substrate support.

24 Claims, 26 Drawing Sheets

1
10
10a
10e
10s
11
111
111a
111b
112
13
13a
13b
13c
W
20
21
22
30
31
31a
31b
32
32a
32b
40
50
50a
50a1
50a2
50a3

PLASMA PROCESSING METHOD AND PLASMA PROCESSING APPARATUS

CROSS-REFERENCE TO RELATED APPLICATIONS

The present application is a continuation of and claims priority to PCT/JP2022/027139, filed on Jul. 8, 2022, the entire disclosure of which is incorporated herein by reference.

The present application is based upon and claims the benefit of the prior Japanese Patent Application No. 2021-116582, filed on Jul. 14, 2021, the entire disclosure of which is incorporated herein by reference.

TECHNICAL FIELD

Exemplary embodiments of the present disclosure relate to a plasma processing method and a plasma processing apparatus.

BACKGROUND

Japanese Patent Application Laid-Open No. 2020-4710 describes a plasma processing apparatus that controls the quantity and quality of radicals and ions.

SUMMARY

The present disclosure provides a technology capable of reducing the influence of RF reflection.

In one exemplary embodiment of the present disclosure, there is provided a plasma processing method of performing plasma processing on a substrate in a plasma processing apparatus. The plasma processing apparatus includes a chamber and a substrate support that is provided in the chamber and is configured to support the substrate, and the plasma processing method includes disposing a substrate on the substrate support, supplying, into the chamber, a processing gas for processing the substrate, generating, in the chamber, a plasma from the processing gas by using a first RF signal and a second RF signal, and supplying a bias signal to the substrate support, in which generating the plasma includes superimposing the second RF signal on the first RF signal based on a timing when the bias signal is supplied to the substrate support.

In one exemplary embodiment of the present disclosure, a plasma processing apparatus is provided. The plasma processing apparatus includes a chamber, a substrate support that is provided in the chamber and is configured to support a substrate, and a controller, in which the controller executes a control of disposing the substrate on the substrate support, supplying, into the chamber, a processing gas for processing the substrate, generating, in the chamber, a plasma from the processing gas by using a first RF signal and a second RF signal, supplying a bias signal to the substrate support, and superimposing the second RF signal on the first RF signal based on a timing when the bias signal is supplied to the substrate support.

DETAILED DESCRIPTION OF DRAWINGS

Figure 1:
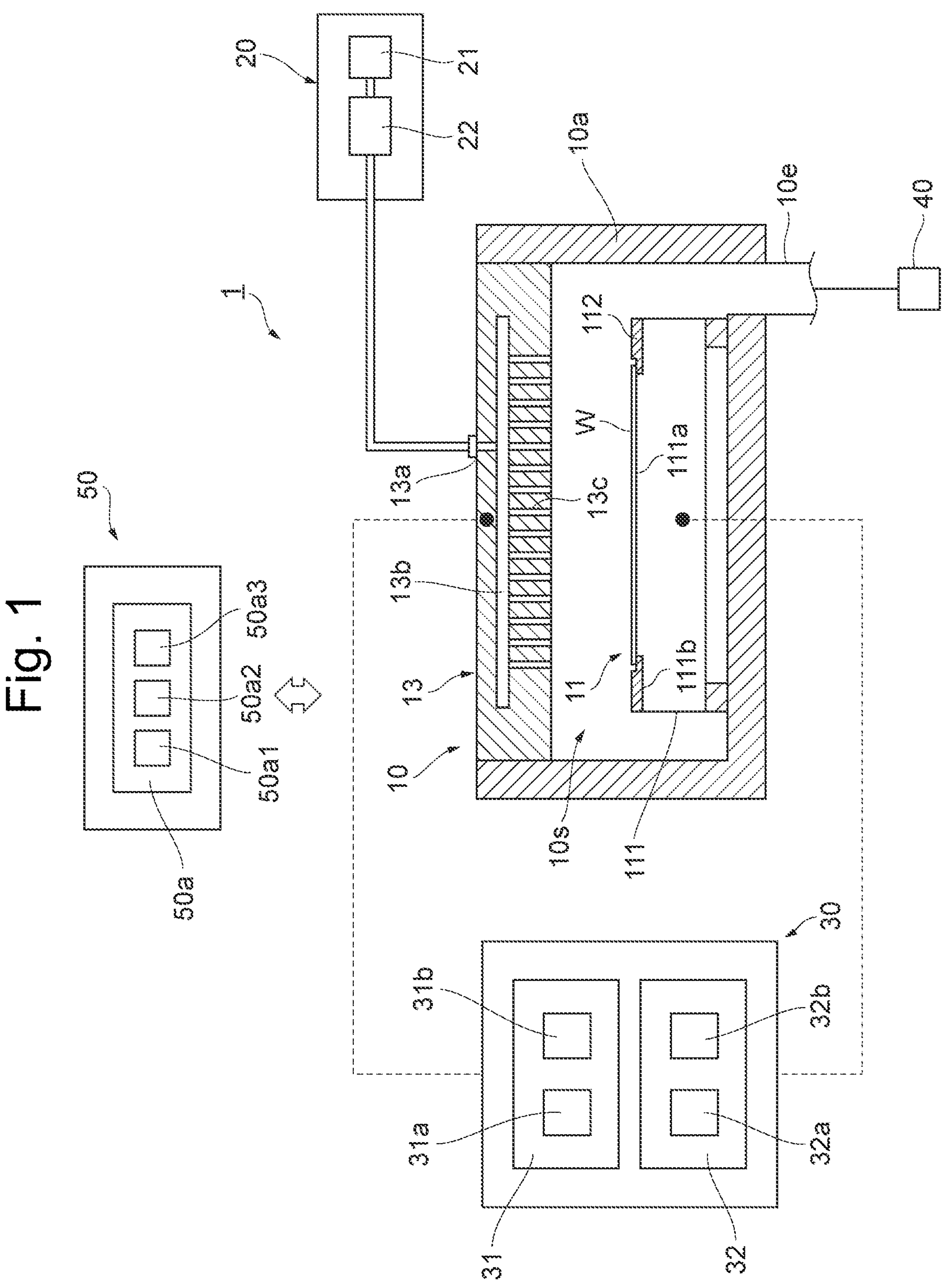
FIG. 1 is a diagram schematically illustrating a substrate processing apparatus 1 according to one exemplary embodiment.

Hereinafter, each embodiment of the present disclosure will be described.

In one exemplary embodiment, there is provided a plasma processing method for performing plasma processing on a substrate in a plasma processing apparatus. The plasma processing apparatus includes a chamber and a substrate support that is provided in the chamber and is configured to support the substrate, and the plasma processing method includes disposing a substrate on the substrate support, supplying, into the chamber, a processing gas for processing the substrate, generating, in the chamber, a plasma from the processing gas by using a first RF signal and a second RF signal, and supplying a bias signal to the substrate support, in which generating the plasma includes superimposing the second RF signal on the first RF signal based on a timing when the bias signal is supplied to the substrate support.

In one exemplary embodiment, the bias signal is a pulse wave configured to periodically include a first electric pulse, the first RF signal is an RF continuous wave having a first frequency, the second RF signal is a pulse wave configured to periodically include a second electric pulse, and the second electric pulse is configured to include an RF having a second frequency different from the first frequency.

In one exemplary embodiment, the first electric pulse is configured to include one or more pulse voltages.

In one exemplary embodiment, the first electric pulse is configured to include an RF continuous wave.

In one exemplary embodiment, a first cycle, which is a cycle in which the first electric pulse repeatedly appears in the bias signal, is equal to a second cycle, which is a cycle in which the second electric pulse repeatedly appears in the second RF signal.

In one exemplary embodiment, in generating the plasma, the first RF signal and the second RF signal are supplied to the substrate support.

In one exemplary embodiment, a timing when the second electric pulse appears is equal to a timing when the first electric pulse stops.

In one exemplary embodiment, a timing when the second electric pulse appears is earlier than a timing when the first electric pulse stops.

In one exemplary embodiment, a timing when the second electric pulse appears is later than a timing when the first electric pulse stops.

In one exemplary embodiment, a period in which the second electric pulse stops in the second cycle is equal to a period in which the first electric pulse appears in the first cycle.

In one exemplary embodiment, a period in which the second electric pulse stops in the second cycle is longer than a period in which the first electric pulse appears in the first cycle.

In one exemplary embodiment, a period in which the second electric pulse stops in the second cycle is shorter than a period in which the first electric pulse appears in the first cycle.

In one exemplary embodiment, a timing when the second electric pulse appears is equal to a timing when the first electric pulse appears.

In one exemplary embodiment, a timing when the second electric pulse appears is earlier than a timing when the first electric pulse appears.

In one exemplary embodiment, a timing when the second electric pulse appears is later than a timing when the first electric pulse appears.

In one exemplary embodiment, a period in which the second electric pulse appears in the second cycle is equal to a period in which the first electric pulse appears in the first cycle.

In one exemplary embodiment, a period in which the second electric pulse appears in the second cycle is longer than a period in which the first electric pulse appears in the first cycle.

In one exemplary embodiment, a period in which the second electric pulse appears in the second cycle is shorter than a period in which the first electric pulse appears in the first cycle.

In one exemplary embodiment, generating the plasma includes further superimposing a third RF signal on the first RF signal based on the timing when the bias signal is supplied to the substrate support.

In one exemplary embodiment, the third RF signal is a pulse wave configured to periodically include a third electric pulse, the third electric pulse is configured to include an RF having a third frequency which is different from the first frequency and the second frequency, and at least a part of the third electric pulse is superimposed on the first RF signal by being temporally superimposed on the second electric pulse.

In one exemplary embodiment, the third RF signal is a pulse wave configured to periodically include a third electric pulse, the third electric pulse is configured to include an RF having a third frequency which is different from the first frequency and the second frequency, and the third electric pulse is superimposed on the first RF signal without being temporally superimposed on the second electric pulse.

In one exemplary embodiment, the second frequency is an integral multiple of the first frequency.

In one exemplary embodiment, the pulse voltage includes a negative voltage.

In one exemplary embodiment of the present disclosure, a plasma processing apparatus is provided. The plasma processing apparatus includes a chamber, a substrate support that is provided in the chamber and is configured to support the substrate, and a controller, in which the controller executes a control of disposing the substrate on the substrate support, supplying, into the chamber, a processing gas for processing the substrate, generating, in the chamber, a plasma from the processing gas by using a first RF signal and a second RF signal, applying a bias signal to the substrate support, and superimposing the second RF signal on the first RF signal based on a timing when the bias signal is applied to the substrate support.

Hereinafter, each embodiment of the present disclosure will be described in detail with reference to the drawings. In each drawing, the same or similar elements will be given the same reference numerals, and repeated descriptions will be omitted. Unless otherwise specified, a positional relationship such as up, down, left, and right will be described based on a positional relationship illustrated in the drawings. A dimensional ratio in the drawings does not indicate an actual ratio, and the actual ratio is not limited to the ratio illustrated in the drawings.

FIG. 1 is a diagram schematically illustrating a substrate processing apparatus 1 according to one exemplary embodiment. The substrate processing apparatus 1 is a capacitively coupled plasma processing apparatus. The substrate processing apparatus 1 includes a plasma processing chamber 10, a gas supply 20, a power supply 30, an exhaust system 40, and a controller 50. Further, the substrate processing apparatus 1 includes a substrate support 11 and a gas introducer. The gas introducer is configured to introduce at least one processing gas into the plasma processing chamber 10. The gas introducer includes a shower head 13. The substrate support 11 is disposed in the plasma processing chamber 10. The shower head 13 is disposed above the substrate support 11. In one exemplary embodiment, the shower head 13 constitutes at least a part of a ceiling of the plasma processing chamber 10. The plasma processing chamber 10 has a plasma processing space **10*s* defined by the shower head 13, a side wall 10*a* of the plasma processing chamber 10, and the substrate support 11. The plasma processing chamber 10 has at least one gas supply port for supplying at least one processing gas to the plasma processing space 10***s*, and at least one gas exhaust port for exhausting the gas from the plasma processing space. The side wall 10*a* is grounded. The shower head 13 and the substrate support 11 are electrically insulated from the housing of the plasma processing chamber 10.

Figure 2:
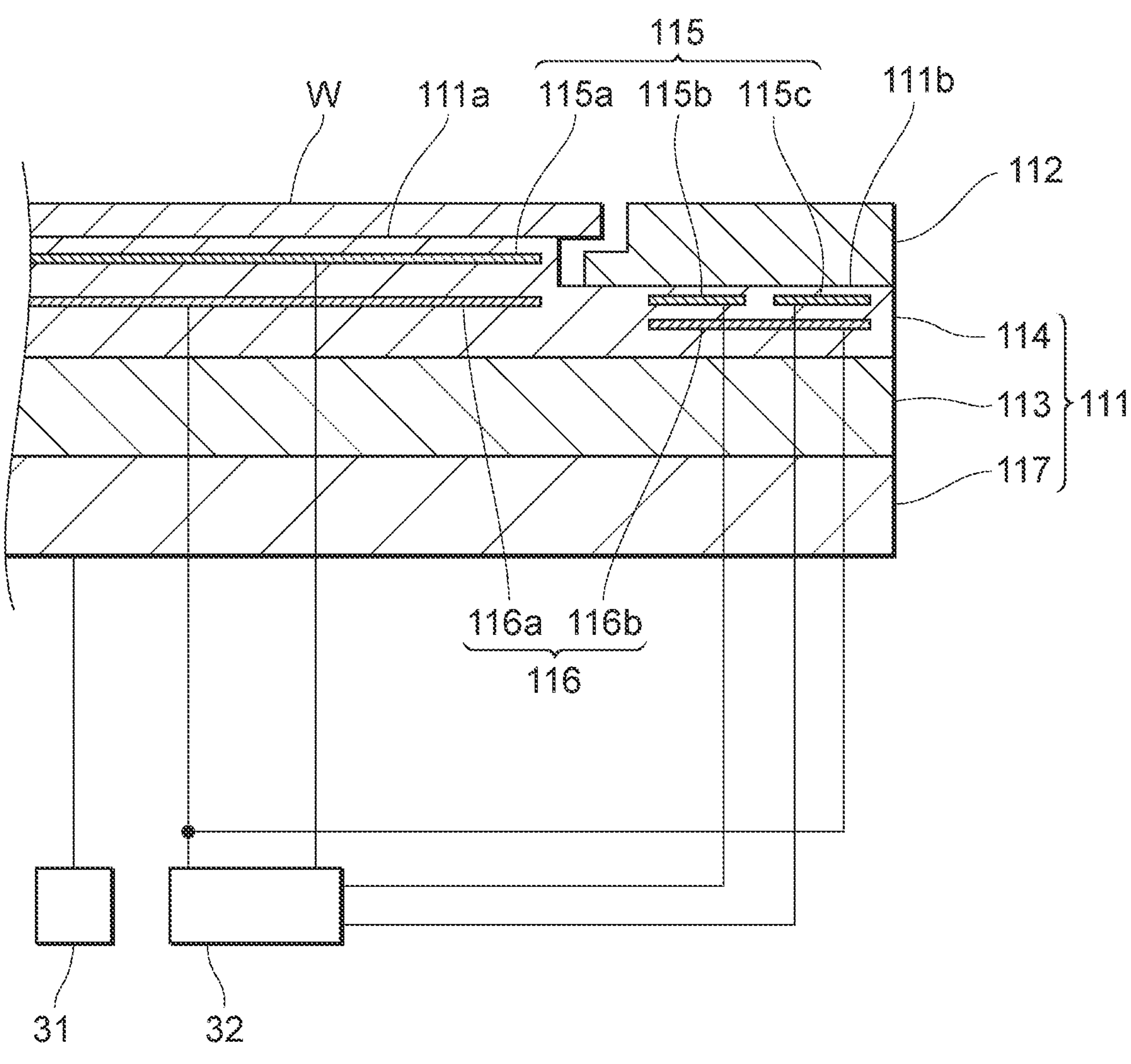
FIG. 2 is a partially enlarged view illustrating an example of a substrate support 11 included in the substrate processing apparatus 1.

FIG. 2 is a partially enlarged view illustrating an example of the substrate support 11 included in the substrate processing apparatus 1. The substrate support 11 includes a main body 111 and a ring assembly 112. The main body 111 includes a base 113, an electrostatic chuck 114, and an electrode plate 117. Further, the main body 111 includes a center region (substrate support surface) 111*a* for supporting a substrate (wafer) W and an annular region (ring support surface) 111*b* for supporting the ring assembly 112. The annular region 111*b* of the main body 111 surrounds the center region 111*a* of the main body 111 in plan view. A substrate W is disposed on the center region 111*a* of the main body 111, and the ring assembly 112 is disposed on the annular region 111*b* of the main body 111 so as to surround the substrate W on the center region 111*a* of the main body 111. The base 113 may include a conductive member. The conductive member of the base 113 may function as a lower electrode. The electrostatic chuck 114 is disposed on the base. An upper surface of the electrostatic chuck 114 has the substrate support surface 111*a*. The ring assembly 112 includes one or more annular members. At least one of the one or more annular members is an edge ring.

The electrostatic chuck 114 includes a chuck electrode 115 and a bias electrode 116 inside the electrostatic chuck 114. The chuck electrode 115 includes an electrode 115*a* provided between the substrate support surface 111*a* and the base 113. The electrode 115*a* may be a flat electrode corresponding to the shape of the substrate support surface 111*a*. Further, the chuck electrode 15 may have electrodes 115*b* and 115*c* provided between the ring assembly 112 and the base 113. The electrodes 115*b* and 115*c* may be annular electrodes that correspond to the shape of the ring assembly 112. Further, the electrode 115*c* is provided outside the electrode 115*b*. The bias electrode 116 has an electrode 116*a* provided between the electrode 115*a* (or the substrate support surface 111*a*) and the base 113. The electrode 116*a* may be a flat electrode corresponding to the shape of the substrate support surface 111*a* and/or the electrode 115*a*. Further, the bias electrode 116 may have an electrode 116*b* provided between the ring assembly and the base 113.

When the conductive member included in the base 113 functions as the lower electrode, the electrostatic chuck 114 may not include the bias electrode 116. Further, the chuck electrode 115 may also function as the lower electrode. When the chuck electrode 115 functions as the lower electrode, the electrostatic chuck 114 may not include the bias electrode 116. Further, in the electrostatic chuck 114, a portion including the electrode 115*a* and the electrode 116*a* and a portion including the electrodes 115*b* and 115*c* and the electrode 116*b* may be configured as separate components.

Further, although not illustrated, the substrate support 11 may include a temperature control module configured to adjust at least one of the electrostatic chuck 114, the ring assembly 112, and the substrate to a target temperature. The temperature control module may include a heater, a heat transfer medium, a flow path, or a combination thereof. A heat transfer fluid such as brine or a gas flows through the flow path. Further, the substrate support 11 may include a heat transfer gas supply configured to supply a heat transfer gas between the back surface of the substrate W and the substrate support surface 111*a*.

Returning to FIG. 1, the shower head 13 is configured to introduce at least one processing gas from the gas supply 20 into the plasma processing space 10*s*. The shower head 13 has at least one gas supply port 13*a*, at least one gas diffusion chamber 13*b*, and a plurality of gas introduction ports 13*c*. The processing gas supplied to the gas supply port 13*a* passes through the gas diffusion chamber 13*b* and is introduced into the plasma processing space 10*s* from the plurality of gas introduction ports 13*c*. Further, the shower head 13 includes a conductive member. The conductive member of the shower head 13 functions as an upper electrode. The gas introducer may include one or more side gas injectors (SGI) attached to one or more openings formed on the side wall 10*a*, in addition to the shower head 13.

The gas supply 20 may include at least one gas source 21 and at least one flow rate controller 22. In one exemplary embodiment, the gas supply 20 is configured to supply at least one processing gas from the gas source 21 corresponding to each of the gases to the shower head 13 via the flow rate controller 22 corresponding to each of the gas sources. Each flow rate controller 22 may include, for example, a mass flow controller or a pressure-controlled flow rate controller. Further, the gas supply 20 may include one or more flow rate modulation devices that modulate or output as pulses of the flow rate of at least one processing gas.

The power supply 30 includes the RF power supply 31 coupled to the plasma processing chamber 10 via at least one impedance matching circuit. The RF power supply 31 is configured to supply at least one RF signal (RF power) such as a source RF signal and a bias RF signal to the conductive member of the substrate support 11 and/or the conductive member of the shower head 13. As a result, plasma is formed from at least one processing gas supplied to the plasma processing space 10*s*. Therefore, the RF power supply 31 may function as at least a part of the plasma generator configured to generate the plasma from one or more processing gases in the plasma processing chamber 10. Further, by supplying the bias RF signal to the conductive member of the substrate support 11, a bias potential is generated in the substrate W, so that it is possible to draw ionic components in the formed plasma into the substrate W.

In one exemplary embodiment, the RF power supply 31 includes a first RF generator 31*a* and a second RF generator 31*b*. The first RF generator 31*a* is configured to be coupled to the conductive member of the substrate support 11 and/or the conductive member of the shower head 13 via at least one impedance matching circuit to generate a source RF signal (source RF power) for generating a plasma. In one exemplary embodiment, the source RF signal is a continuous wave or a pulse wave configured to include RF having a frequency in the range of 13 MHz to 150 MHz. In one exemplary embodiment, the first RF generator 31*a* may be configured to generate a plurality of source RF signals having different frequencies. The generated one or more source RF signals are supplied to the conductive member of the substrate support 11 and/or the shower head 13. The one or more source RF signals may be supplied to the base 113, the chuck electrode 115, or the bias electrode 116 in the substrate support 11. The second RF generator 31*b* is configured to be coupled to the conductive member of the substrate support 11 via at least one impedance matching circuit to generate a bias RF signal (bias RF power). In one exemplary embodiment, the bias RF signal has a lower frequency than the source RF signal. In one exemplary embodiment, the bias RF signal is a continuous wave or a pulse wave configured to include RF having a frequency in the range of 400 kHz to 13.56 MHz. In one exemplary embodiment, the second RF generator 31*b* may be configured to generate a plurality of bias RF signals having different frequencies. The generated one or more bias RF signals are supplied to the base 113, the chuck electrode 115, or the bias electrode 116 of the substrate support 11. Further, in various embodiments, at least one of the source RF signals and the bias RF signals may be output as pulses.

Further, the power supply 30 may include a DC power supply 32 coupled to the plasma processing chamber 10. The DC power supply 32 includes a first DC generator 32*a* and a second DC generator 32*b*. In one exemplary embodiment, the first DC generator 32*a* is configured to be connected to the conductive member of the substrate support 11 to generate a first DC signal. The generated first bias DC signal is applied to the conductive member of the substrate support 11. In one exemplary embodiment, the first DC signal may be applied to the base 113 of the substrate support 11, the chuck electrode 115, or the electrode 116*a* and/or the electrode 116*b* included in the bias electrode 116. In one exemplary embodiment, the second DC generator 32*b* is configured to be connected to the conductive member of the shower head 13 to generate a second DC signal. The generated second DC signal is applied to the conductive member of the shower head 13. In various embodiments, at least one of the first and second DC signals may be output as pulses. The first and second DC generators 32*a* and 32*b* may be provided in addition to the RF power supply 31, and the first DC generator 32*a* may be provided in place of the second RF generator 31*b*.

The DC power supply 32 generates a DC voltage to be applied to the electrodes 115*a*, 115*b*, and 115*c* included in the chuck electrode 115 (see FIG. 2). The electrodes 115*b* and 115*c* may form a bipolar electrostatic chuck. Further, the electrodes 115*a*, 115*b*, and 115*c* may be integrally formed. The DC power supply 32 may be configured to apply different DC voltages to the electrodes 115*a*, 115*b*, and 115*c*, respectively, or may be configured to apply the same DC voltage. The power supply 30 may have a power supply that generates a voltage applied to the chuck electrode 115, in addition to the DC power supply 32.

The exhaust system 40 may be connected to, for example, a gas exhaust port 10*e* provided at a bottom portion of the plasma processing chamber 10. The exhaust system 40 may include a pressure regulating valve and a vacuum pump. The pressure in the plasma processing space 10*s* is adjusted by the pressure regulating valve. The vacuum pump may include a turbomolecular pump, a dry pump, or a combination thereof.

The controller 50 processes a computer-executable instruction that causes the substrate processing apparatus 1 to execute various steps described in the present disclosure. The controller 50 may be configured to control each element of the substrate processing apparatus 1 to execute the various steps described here. In one exemplary embodiment, a part or all of the controller 50 may be provided as a part of the configuration of an external apparatus of the substrate processing apparatus 1. The controller 50 may include, for example, a computer 50*a*. The computer 50*a* may include, for example, a processor (CPU: central processing unit) 50*a*1, a storage 50*a*2, and a communication interface 50*a*3. The processor 50*a*1 may be configured to perform various control operations based on the program stored in the storage 50*a*2. The storage 50*a*2 may include a random access memory (RAM), a read only memory (ROM), a hard disk drive (HDD), a solid state drive (SSD), or a combination thereof. The communication interface 50*a*3 may communicate with another configuration of the substrate processing apparatus 1 via a communication line such as a local area network (LAN) or the like.

In addition to the capacitively coupled plasma (CCP), the plasma formed in the plasma processing space may be an inductively coupled plasma (ICP), an electron-cyclotron-resonance (ECR) plasma, a helicon wave plasma (HWP), a surface wave plasma (SWP) or the like. Further, various types of plasma generators including an alternating current (AC) plasma generator and a direct current (DC) plasma generator may be used. In one embodiment, the AC signal (AC power) used in the AC plasma generator has a frequency in the range of 100 kHz to 10 GHz. Therefore, the AC signal includes a radio frequency (RF) signal and a microwave signal. In one embodiment, the RF signal has a frequency in the range of 200 kHz to 150 MHz.

Figure 3:
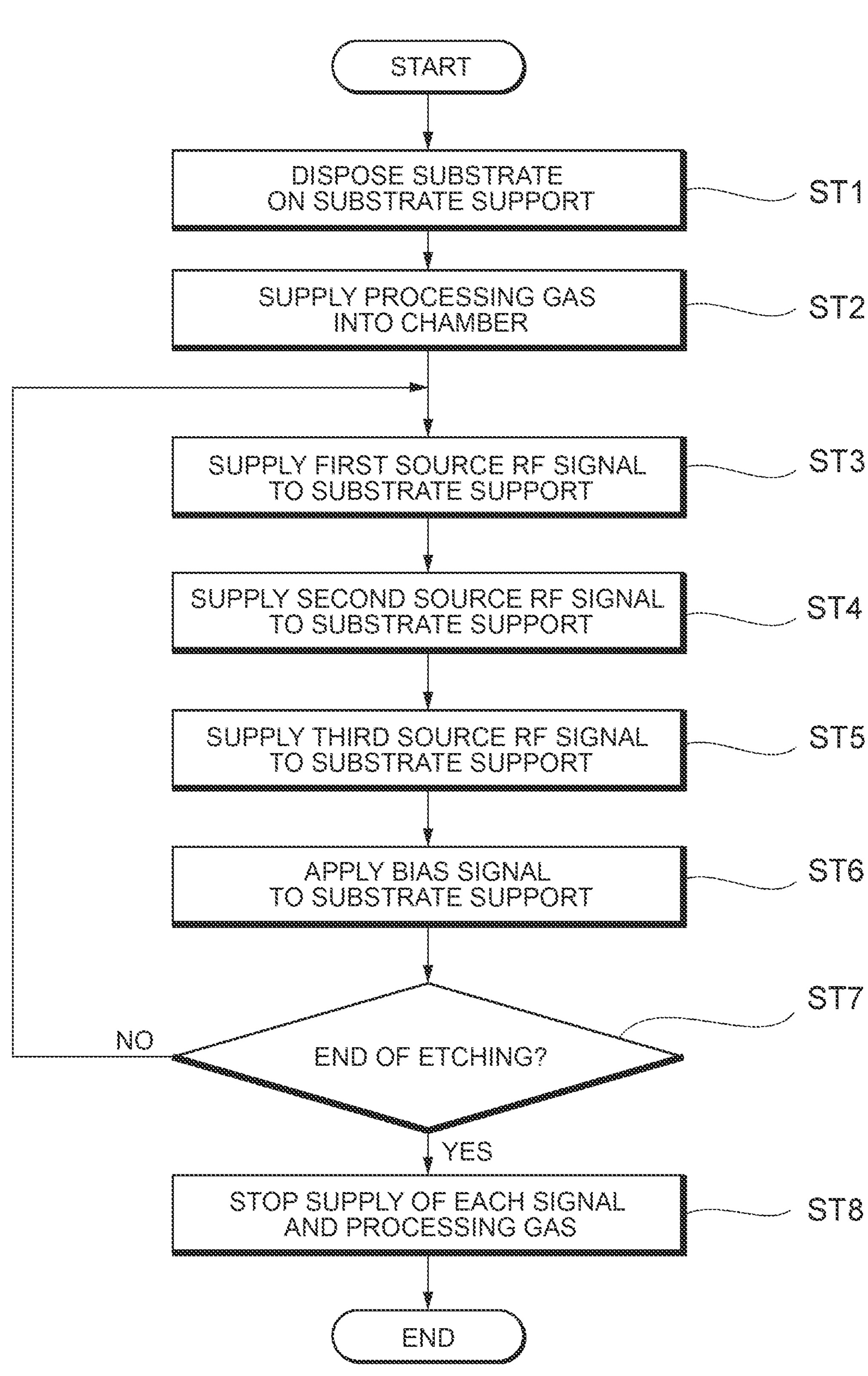
FIG. 3 is a flowchart illustrating an example of a plasma processing method according to one exemplary embodiment.
Figure 4:
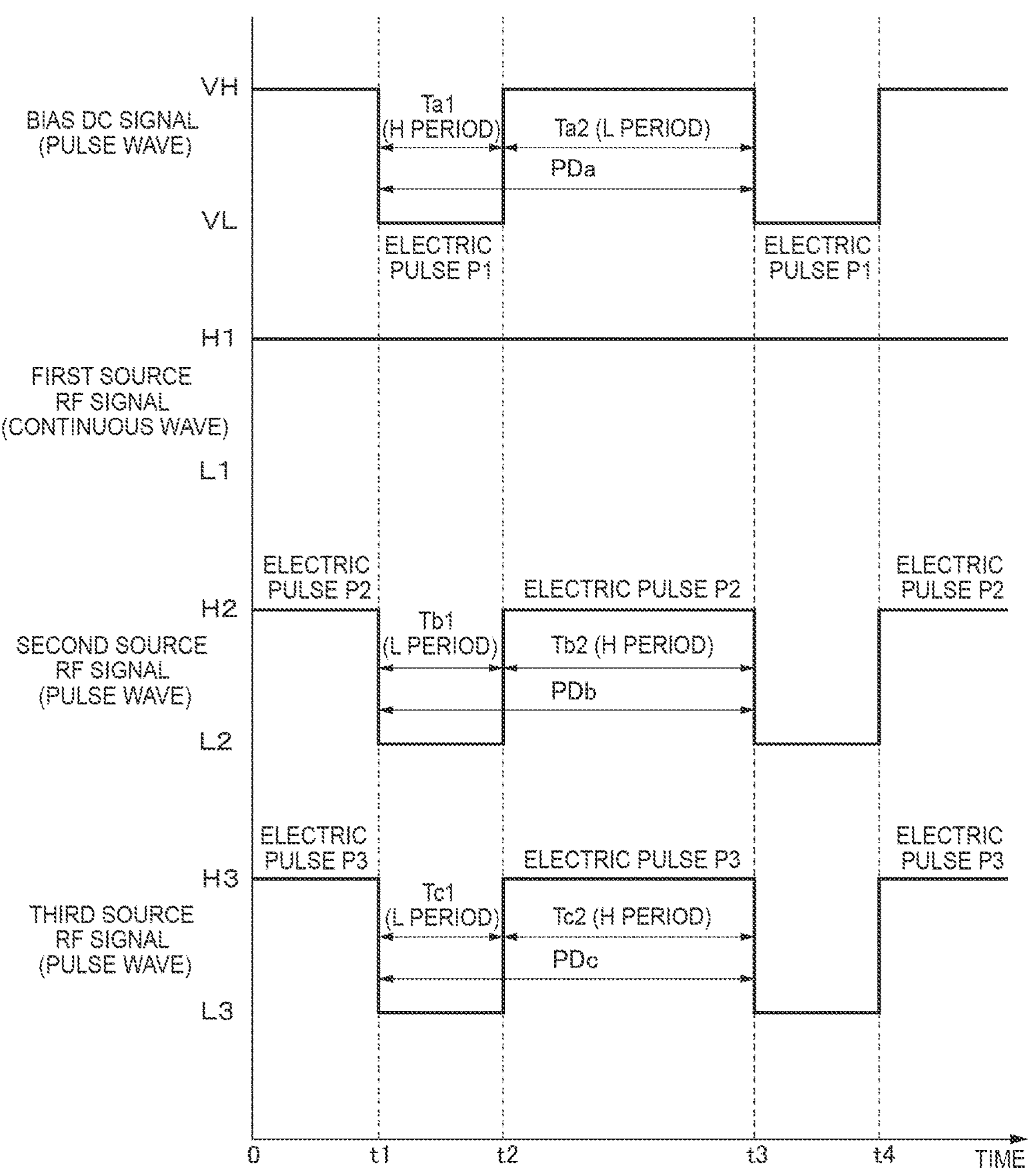
FIG. 4 is a timing chart illustrating an example of each source RF signal and a bias signal in the present processing method.
Figure 5A:
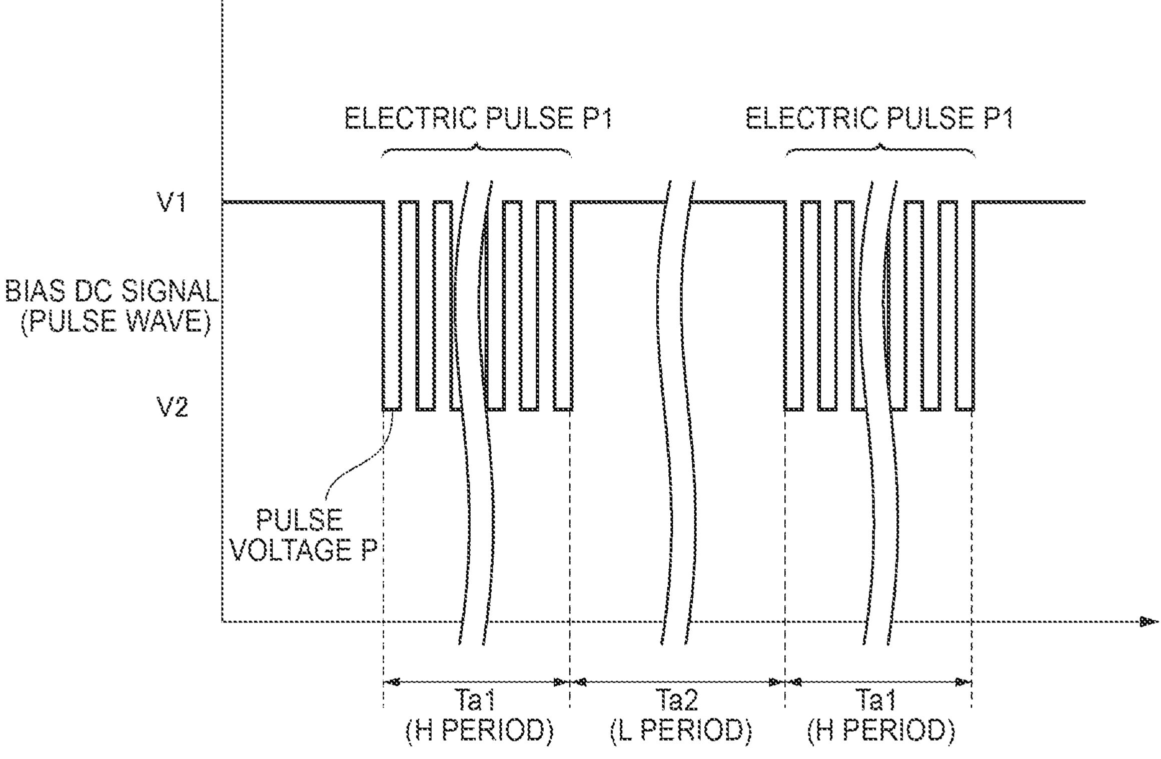
FIG. 5A is a diagram illustrating an example of an electric pulse P1 included in a bias DC signal.
Figure 5B:
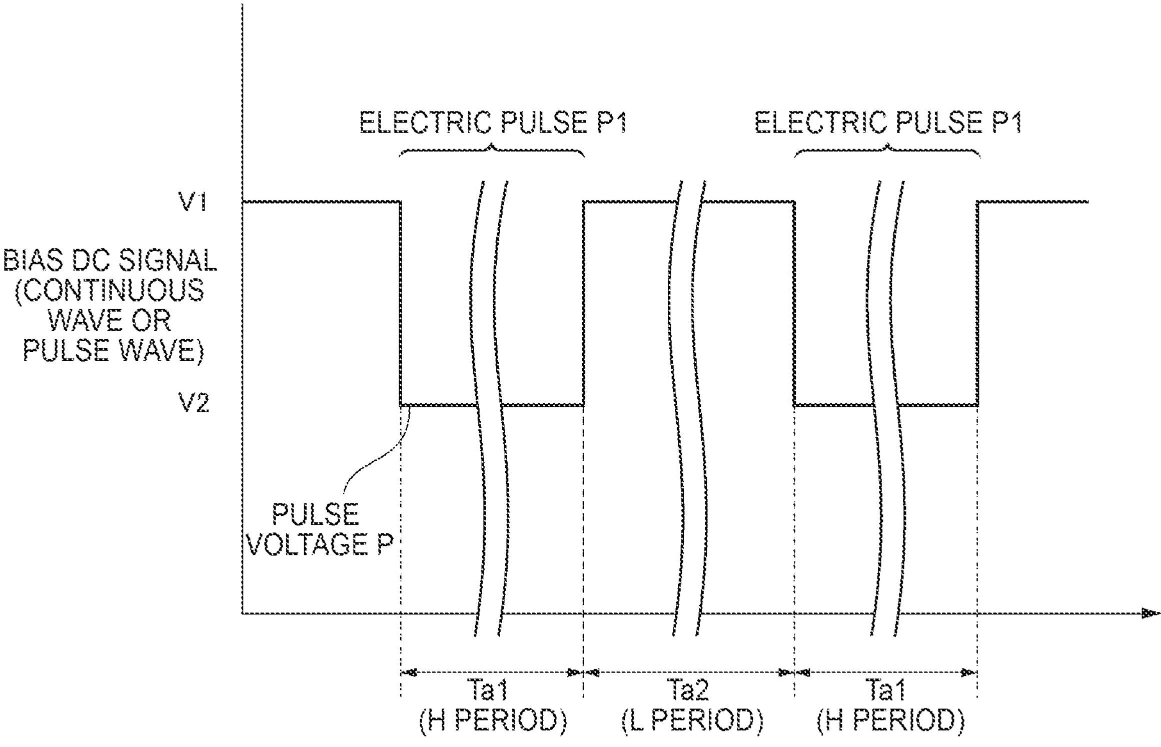
FIG. 5B is a diagram illustrating an example of the electric pulse P1 included in the bias DC signal.
Figure 5C:
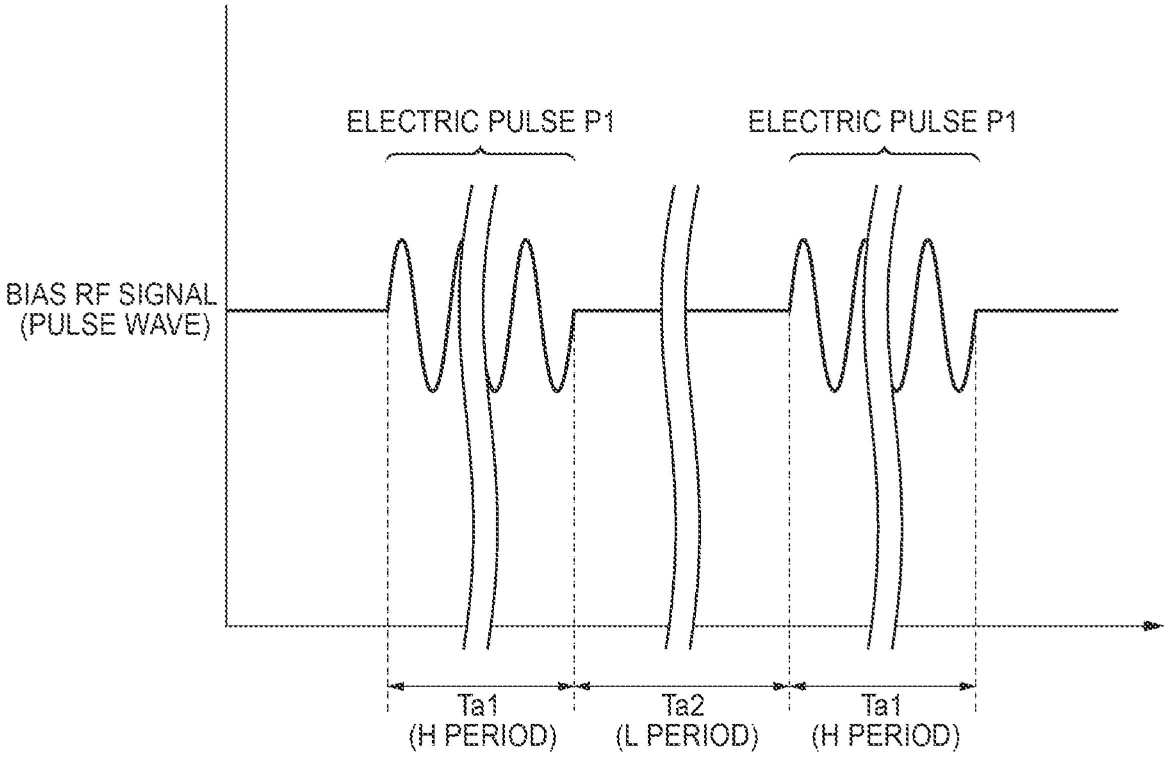
FIG. 5C is a diagram illustrating an example of the electric pulse P1 included in a bias RF signal.
Figure 6:
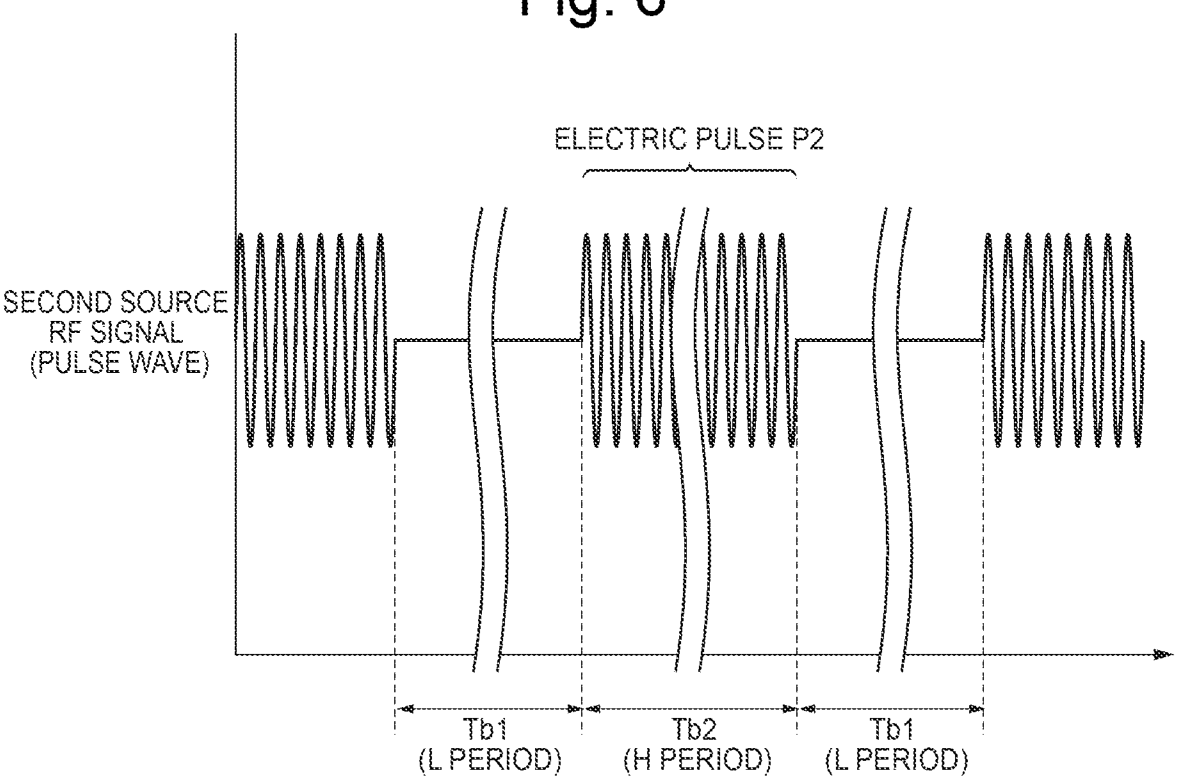
FIG. 6 is a diagram illustrating an example of an electric pulse P2 included in a second source RF signal.
Figure 7:
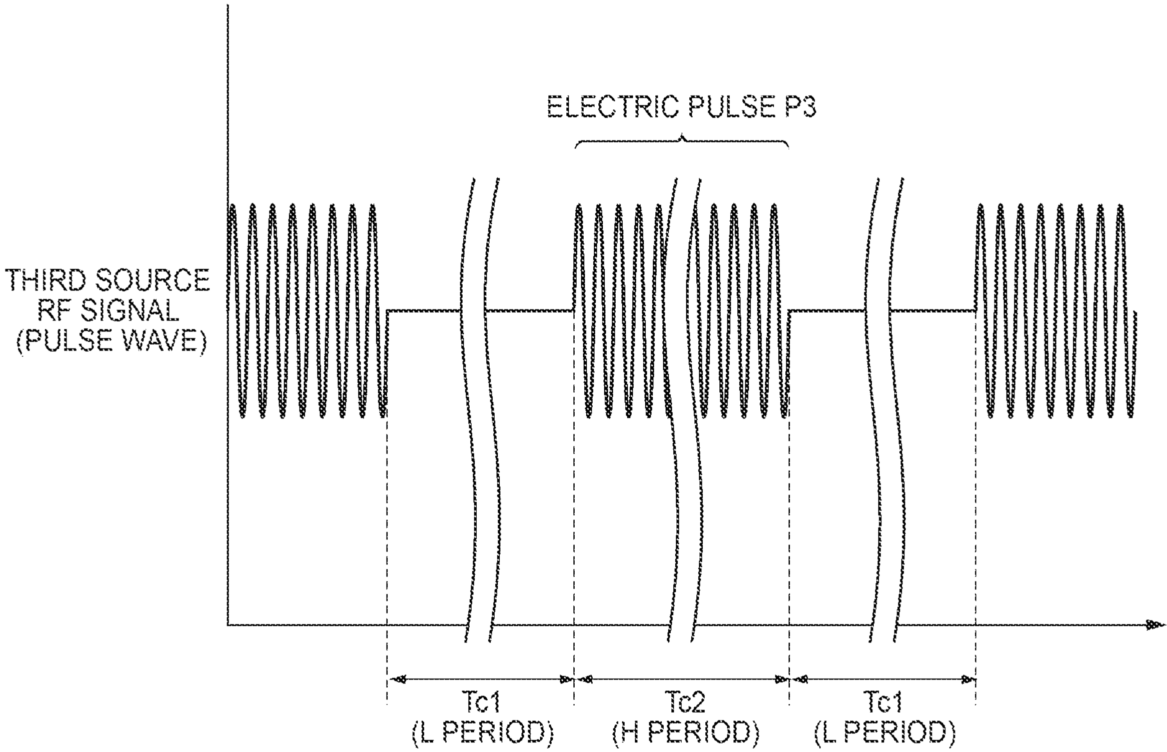
FIG. 7 is a diagram illustrating an example of an electric pulse P3 included in a third source RF signal.

FIG. 3 is a flowchart illustrating a plasma processing method (hereinafter, also referred to as "the present processing method") according to one exemplary embodiment. FIG. 4 is an example of a timing chart illustrating the first, second, and third source RF signals and the bias DC signal in the present processing method. FIGS. 5A to 5C are diagrams illustrating examples of an electric pulse P1 included in the bias signal. FIG. 6 is a diagram illustrating an example of an electric pulse P2 included in the second source RF signal. FIG. 7 is a diagram illustrating an example of an electric pulse P3 included in the third source RF signal. In FIGS. 4 to 7, the horizontal axis represents time. Further, in FIGS. 4 to 7, the vertical axis represents the power level of each source RF signal (for example, an effective value of the power of each source RF signal) and/or the voltage, voltage level, or power level of the bias signal.

In FIG. 4, the bias DC signal is an example of the bias signal. "VL" and "VH" of the bias DC signals indicate the voltage level of the bias DC signal (for example, an effective value of the voltage of the bias DC signal). In the example illustrated in FIG. 4, the bias applied to the substrate support 11 by the bias DC signal is larger in an H period than an L period. As will be described later in FIG. 5C, the bias signal may be the bias RF signal.

Further, in FIG. 4, "L1" of the first source RF signal (an example of the first RF signal) indicates that an RF power level of the first source RF signal is zero or lower than the power level indicated by "H1". Further, in FIG. 4, "L2" of the second source RF signal (an example of the second RF signal) indicates that an RF power level of the second source RF signal is zero or lower than the power level indicated by "H2". Further, "L3" of the third source RF signal (an example of the third RF signal) indicates that an RF power level of the third source RF signal is zero or lower than the power level indicated by "H3".

As illustrated in FIG. 3, the present processing method includes a step (ST1) of disposing the substrate W on the substrate support 11, a step (ST2) of supplying the processing gas into the plasma processing chamber 10, a step (ST3) of periodically supplying the first source RF signal (an example of the first RF signal) to the substrate support 11, a step (ST4) of periodically supplying the second source RF signal (an example of the second RF signal) to the substrate support 11, a step (ST5) of supplying the third source RF signal (an example of the third RF signal) to the substrate support 11, a step (ST6) of supplying a bias signal, a step (ST7) of determining the end of etching, and a step (ST8) of stopping the supply of each signal (the first, second, and third source RF signals and the bias signal) and the processing gas.

In step ST1, the substrate W is disposed in the substrate support 11. The substrate W may be, for example, a substrate in which a underlying film, an etched film to be etched by the present processing method, a mask film having a predetermined pattern, and the like are stacked on a silicon wafer. The etched film may be, for example, a dielectric film, a semiconductor film, a metal film, or the like.

In step ST2, the processing gas is supplied into the plasma processing chamber 10. The processing gas is a gas used for etching the etched film that is formed on the substrate W. The type of processing gas may be appropriately selected based on the material of the etched film, the material of the mask film, the material of the underlying film, the pattern of the mask film, the etching depth, and the like.

In steps ST3 to ST5, the first, second, and third source RF signals are supplied to the substrate support 11. The first RF generator 31*a* may generate each source RF signal as a separate signal to supply the source RF signal to the substrate support 11, and, in addition, may supply one signal including a synthesized wave in which the waveform of each source RF signal is synthesized to the substrate support 11.

The first source RF signal is, for example, the RF continuous wave having a power level of H1. As illustrated in FIG. 6, the second source RF signal is, for example, a signal that alternately repeats an L period in which the RF power level of the second source RF signal is low and an H period in which the power level is high. Further, as illustrated in FIG. 7, the third source RF signal is, for example, a signal that alternately repeats an L period in which the RF power level of the third source RF signal is low and an H period in which the power level is high. That is, the second source RF signal and the third source RF signal are pulse waves including an electric pulse having RF in the H period.

The respective RF frequencies included in the first, second, and third source RF signals may be different from each other. As an example, the respective RF frequencies included in the first, second, and third source RF signals may be in the range of 1 to 200 MHz. Further, the respective RF frequencies may be any of 13.56 MHz, 40.68 MHz, 60 MHz, and 100 MHz. The respective RF frequencies included in the first, second, and third source RF signals are, for example, 40.68 MHz, 60 MHz, and 100 MHz, respectively. The respective RFs included in the first, second, and third source RF signals may be integral multiples of a certain frequency, respectively. In the present processing method, the second and/or the third source RF signal is superimposed on the first source RF signal, so that the synthesized wave is formed. In the example illustrated in FIG. 4, two source RF signals (second and third source RF signals) are superimposed on the first source RF signal, and the synthesized wave is formed. The number of RF signals superimposed on the first source RF signal may be 1 or more, and may be 3 or more. The frequencies of the source RF signals (for example, the second and third source RF signals) superimposed on the first source RF signal may be modulated according to a frequency at which the pulse voltage P repeatedly appears in the bias DC signal or the RF frequency included in the bias RF signal. For example, the amount of modulation of the frequencies of the source RF signals (for example, the second and third source RF signals) superimposed on the first source RF signal may be in the range using the frequency at which the pulse voltage P repeatedly appears in the bias DC signal or the RF frequency included in the bias RF signal as the upper and lower limits. For example, when the frequency of the second source RF signal is 40.68 MHz and the frequency at which the pulse voltage P repeatedly appears in the bias DC signal is 400 kHz, the frequency of the second source RF signal may be modulation in the range of 40.68 MHz±400 kHz.

When the first, second, and/or third source RF signals are supplied to the substrate support 11, a plasma is formed from the processing gas supplied into the plasma processing chamber 10. In other embodiments, each source RF signal may be supplied to the upper electrode included in the shower head 13. The present processing method may be executed by using the substrate processing apparatus that uses an arbitrary plasma source, such as an inductively coupled plasma or a microwave plasma, besides the capacitively coupled substrate processing apparatus 1. In that case, the first, second, and/or third source RF signals may be supplied to any electrode or coil included in each substrate processing apparatus.

A bias signal is applied to the substrate support 11 in step ST6. As an example, when the bias signal is the bias DC signal, as shown in FIG. 4, the bias DC signal may be a pulse wave having an H period in which an effective value of the voltage is VL and an L period in which the effective value of the voltage is VH that is higher than VL, the H period and the L period being alternately repeated. For example, the bias DC signal includes the electric pulse P1 of which the effective value of the voltage becomes a negative voltage in the H period. In the bias signal, the electric pulse P1 appears periodically. The frequency at which the electric pulse P1 repeatedly appears in the bias DC signal may be 10 Hz to 2 MHz. Further, the frequency may be 10 Hz to 100 kHz. In one example, the frequency is the reciprocal of a period PDa in FIG. 4. As illustrated in FIG. 4, in the bias DC signal, the electric pulse P1 may appear periodically with the period PDa as one cycle. As illustrated in FIGS. 5A and 5B, the electric pulse P1 may include one or more pulse voltages P. FIG. 5A illustrates an example in which the electric pulse P1 includes two or more pulse voltages P. Further, FIG. 5B illustrates an example in which the electric pulse P1 includes one pulse voltage P.

As illustrated in FIGS. 5A and 5B, as an example, the bias DC signal may be a constant voltage V1 (=VH) in the L period. V1 may be 0 V, a positive voltage, or a negative voltage. Further, as an example, as illustrated in FIG. 5A, in the H period of the bias DC signal, the electric pulse P1 of the bias DC signal may include a pulse voltage P that periodically repeats. In the example illustrated in FIG. 5A, the frequency at which the pulse voltage P repeatedly appears in the bias DC signal may be 50 kHz to 2 MHz. Further, the frequency may be 100 kHz to 800 kHz. In an example, the frequency is the reciprocal of the sum of a period in which one pulse voltage P appears and a period in which the pulse voltage P stops, in FIG. 5A. Further, as illustrated in FIG. 5B, in the L period of the bias DC signal, the electric pulse P1 of the bias DC signal may include one pulse voltage P. In the example illustrated in FIG. 5B, the frequency at which the pulse voltage P or the electric pulse P1 repeatedly appears in the bias DC signal may be 50 kHz to 2 MHz. Further, the frequency may be 100 kHz to 800 kHz. In one example, the frequency is the reciprocal of the sum of a period Ta1 and a period Ta2 in FIG. 5B. In the example illustrated in FIGS. 5A and 5B, the pulse voltage P includes V2 which is a voltage lower than V1. V2 may be a negative voltage. Further, the waveform indicated by one or more pulse voltages P included in the electric pulse P1 may be, in addition to the rectangular wave illustrated in FIGS. 5A and 5B, a waveform, such as a triangular wave, a trapezoidal wave, or an impulse, in which the voltage changes at a constant cycle so that it is possible to apply a predetermined bias voltage to the upper electrode or the substrate support 11.

As illustrated in FIG. 5C, the bias signal may be a bias RF signal. In the example illustrated in FIG. 5C, the bias RF signal may be a pulse wave including an electric pulse P1 in the H period. The electric pulse P1 may be configured to include an RF continuous wave. That is, in the example illustrated in FIG. 5C, the bias RF signal may be a signal that alternately repeats an H period which is a period in which the RF power level of the bias RF signal is high, and an L period which is a period in which the power level is low. The power level of the bias RF signal may be zero in the L period. The RF frequency included in the electric pulse P1 may be, for example, 50 kHz to 15 MHz. Further, the frequency may be 200 kHz to 15 MHz. Further, the frequency at which the electric pulse P1 repeatedly appears in the bias RF signal may be 10 Hz to 2 MHz. Further, the frequency may be 10 Hz to 100 kHz.

Steps ST3 to ST6 may start at the same time, or may start at different timings. When the steps ST3 to ST6 start at different timings, the order may be arbitrary.

In step ST7, it is determined whether or not to end the etching process of the etched film. When the etching process is continued, the process returns to step ST3, and steps ST3 to ST7 are continued. On the other hand, when the etching process is end, in step ST8, the supply of each signal and processing gas stops, and the etching process is ended.

FIG. 4 and FIGS. 8 to 25 are examples of timing charts illustrating the bias DC signal as an example of the bias signal and the first, second, and third source RF signals in steps ST3 to ST6. FIG. 4 and FIGS. 8 to 25 illustrate a part of a period in which steps ST3 to ST6 are executed. Hereinafter, the relationship of the respective signals in steps ST3 to ST6 will be described with reference to FIG. 4 and FIGS. 8 to 25. In the examples illustrated in FIG. 4 and FIGS. 8 to 25, the bias RF signal may be supplied to the substrate support 11, instead of the bias DC signal.

FIG. 4 is a timing chart illustrating an example of the present processing method. In the present example, when the first, second, and/or third source RF signals are supplied to the substrate support 11, a plasma of the processing gas is generated in the plasma processing chamber 10. On the other hand, the bias DC signal includes an H period including the electric pulse P1 configured to include the pulse voltage P (see FIGS. 5A and 5B) and an L period in which the voltage level is constant. Then, when the electric pulse P1 (that is, the pulse voltage P) of the bias DC signal is applied to the substrate support 11 in the H period, the active species present in the plasma generated by the first, second, and/or third source RF signals are attracted to the substrate W disposed in the substrate support 11. As a result, positive ions collide with the etched film formed on the substrate W and etching is performed on the etched film.

Specifically, the voltage level of the bias DC signal is VL at time t1. As a result, the electric pulse P1 appears in the bias DC signal, and the electric pulse P1 is applied to the substrate support 11 (hereinafter, the appearance of the electric pulse P1 in the bias signal is also referred to as "the electric pulse P1 is turned on"). The electric pulse P1 is applied to the substrate support 11 during a period (period Ta1) from time t1 to time t2. When the electric pulse P1 is applied to the substrate support 11, the active species present in the plasma are attracted to the substrate W disposed on the substrate support 11. As a result, positive ions collide with the etched film formed on the substrate W and etching is performed on the etched film.

At time t2, when the voltage level of the bias DC signal is VH, the electric pulse P1 in the bias DC signal stops and the application of the electric pulse P1 to the substrate support 11 stops (hereinafter, the stop of the electric pulse P1 in the bias signal is also referred to as "the electric pulse P1 is turned off".). At time t3 in which the period Ta2 elapses from time t2, a period PDa, which is one cycle of the bias DC signal, ends. Further, at time t3, the voltage level of the bias DC signal becomes VL again, and a next cycle of the bias DC signal starts.

The power level of the second source RF signal periodically changes in synchronization with the phase of the bias DC signal. In the example illustrated in FIG. 4, first the voltage level of the second source RF signal is H2 from time 0 to time t1. As a result, the electric pulse P2 (see FIG. 6) configured to include an RF appears in the second source RF signal and is supplied to the substrate support 11 (hereinafter, the appearance of the electric pulse P2 in the second source RF signal is also referred to as "the electric pulse P2 is turned on"). Then, when the electric pulse P1 of the bias DC signal is turned on at time t1, the voltage level of the second source RF signal is L2. As a result, the electric pulse P2 of the second source RF signal stops, and the supply of the electric pulse P2 to the substrate support 11 stops (hereinafter, the stop of the electric pulse P2 in the second source RF signal is also referred to as "the electric pulse P2 is turned off".).

When the electric pulse P1 is turned off at time t2 in which a period Tb1 elapses from time t1, the electric pulse P2 of the second source RF signal is turned on. Then, at time t3 in which the period Tb2 elapses from time t2, PDb which is one cycle of the second source RF signal ends. Further, at time t3, the electric pulse P2 of the second source RF signal is turned on again, and a next cycle of the second source RF signal starts.

The power level of the third source RF signal periodically changes in synchronization with the phase of the bias DC signal. In the example illustrated in FIG. 4, first, the voltage level of the third source RF signal is H3 from time 0 to time t1. As a result, the electric pulse P3 (see FIG. 6) configured to include an RF appears in the third source RF signal and the electric pulse P3 is supplied to the substrate support 11 (hereinafter, the appearance of the electric pulse P3 in the third source RF signal is also referred to as "the electric pulse P3 is turned on"). Then, when the pulse of the bias DC signal is turned on at time t1, the voltage level of the third source RF signal is L3. As a result, the electric pulse P3 of the third source RF signal stops, and the supply of the electric pulse P3 to the substrate support 11 stops (hereinafter, the stop of the electric pulse P3 in the second source RF signal is also referred to as "the electric pulse P3 is turned off.").

When the electric pulse P1 of the bias voltage is turned off at time t2 in which a period Tc1 elapses from time t1, the electric pulse P3 of the third source RF signal is turned on. Then, at time t3 in which a period Tc2 elapses from time t2, PDc which is one cycle of the third source RF signal ends. Further, the electric pulse P3 of the third source RF signal is turned on again at time t3, and a next cycle of the third source RF signal starts.

As described above, in the example illustrated in FIG. 4, the RF and the electric pulse P1 (that is, the pulse voltage P) included in the first source RF signal is supplied to the substrate support 11 in the period Ta1. On the other hand, in the period Ta2 in which the electric pulse P1 of the bias DC signal is turned off, the RF synthesized wave included in each of the first, second, and third source RF signals is supplied to the substrate support 11. As a result, it is possible to reduce the influence of the reflection or the like of the first source RF signal on the plasma density in the period Ta2 during which the electric pulse P1 is not applied to the substrate support 11. Therefore, it is possible to improve the generation efficiency of the plasma by the source RF signal. Further, in the period Ta2 during which the electric pulse P1 is not applied to the substrate support 11, it is possible to increase the plasma density and lower the electron temperature in the plasma. Thus, it is possible to control the plasma density and/or the electron temperature in the plasma according to the timing when the electric pulse P1 is applied to the substrate support 11.

Figure 8:
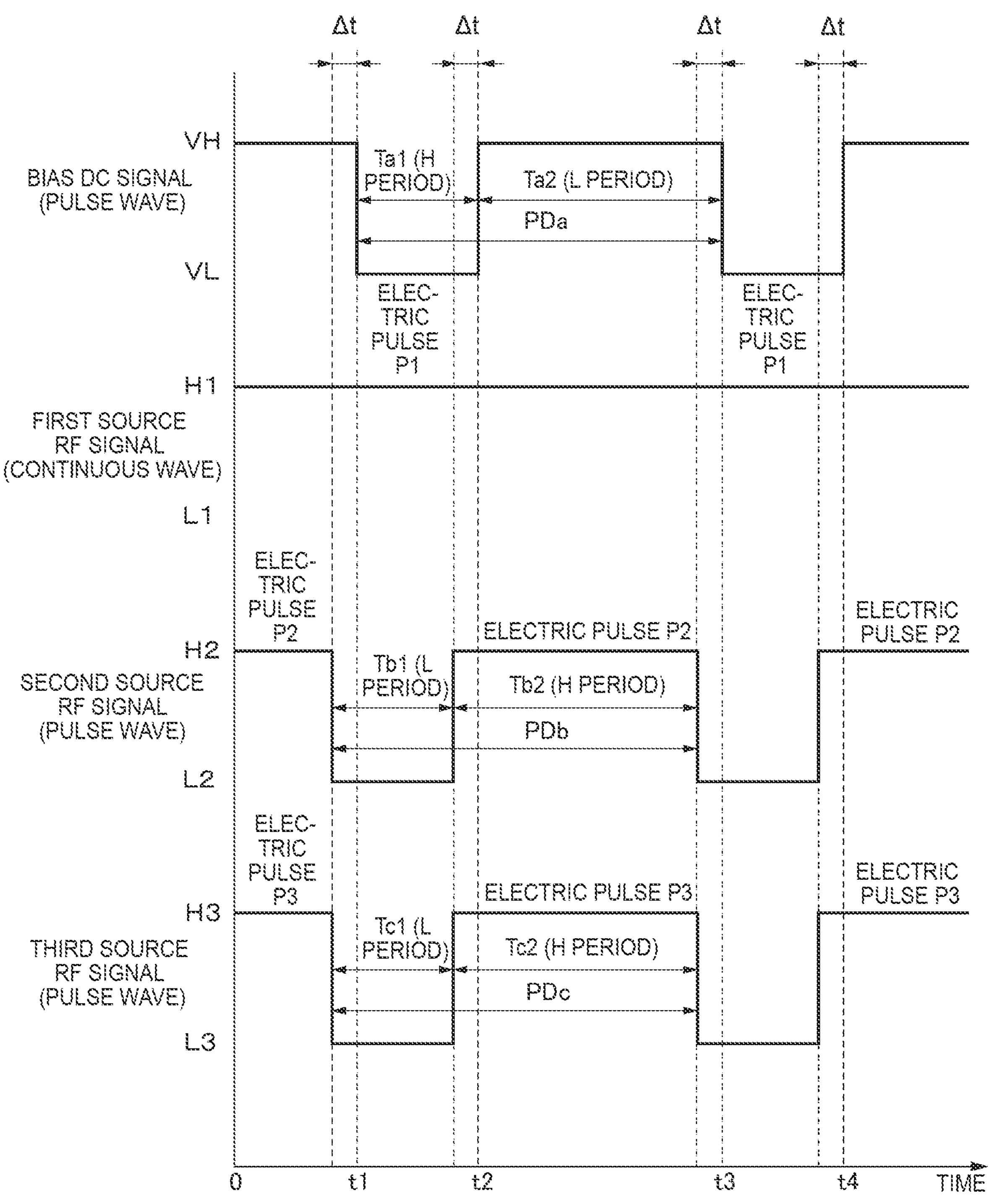
FIG. 8 is a timing chart illustrating another example of the present processing method.

FIG. 8 is a timing chart illustrating another example of the present processing method. The example of FIG. 8 is different from the example described in FIG. 4 at timings when the electric pulses P2 and P3 of the second and third source RF signals are turned on or off. That is, in the example of FIG. 8, the electric pulses P2 and P3 of the second and third source RF signals are turned off at time which is earlier by Δt than time t1 in which the electric pulse P1 of the bias DC signal is turned on. That is, the periods Tb1 and Tc1 in which the electric pulses P2 and P3 of the second and third source RF signals are turned off are temporally advanced by Δt from the period Ta1 in which the pulse voltage P1 of the bias DC signal is turned on. Similarly, the electric pulses P2 and P3 of the second and third source RF signals are turned on at time which is earlier by Δt than time t2 in which the electric pulse P1 of the bias DC signal is turned off. That is, the periods Tb2 and Tc2 in which the electric pulses P2 and P3 of the second and third source RF signals are turned on are temporally advanced by Δt from the period Ta2 in which the electric pulse P1 of the bias DC signal is turned on.

As described above, the example illustrated in FIG. 8 matches the example of FIG. 4 in that the lengths of the period PDb and the period PDc are equal to the period PDa. Further, in the example illustrated in FIG. 8, the duty ratios of the second and third source RF signals match the duty ratio of the bias DC signal. On the other hand, the example illustrated in FIG. 8 is different from the example of FIG. 4 in that the periods Tb1 and Tb2 and the periods Tc1 and Tc2 are advanced by Δt from the periods Ta1 and Ta2, respectively.

Figure 9:
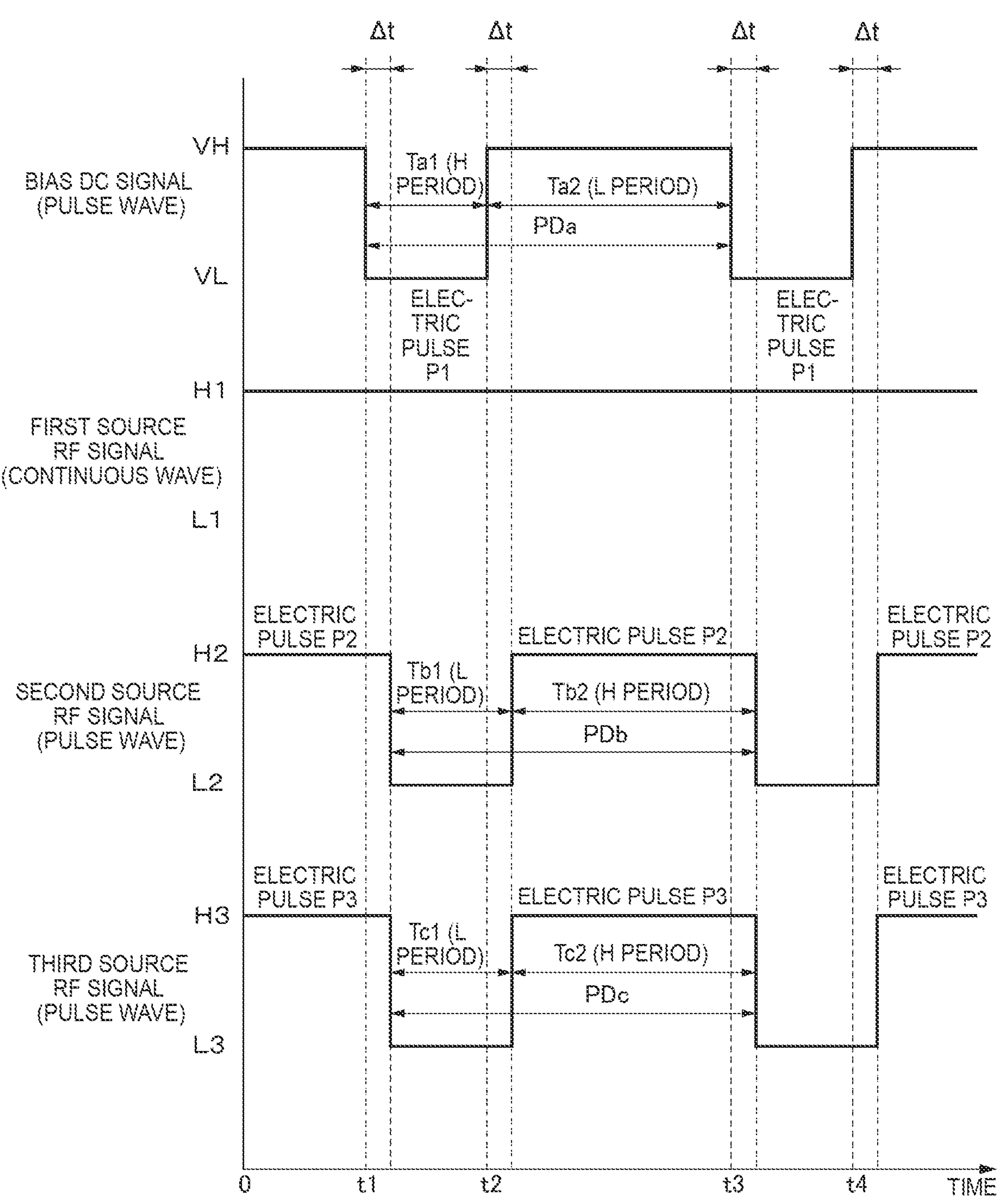
FIG. 9 is a timing chart illustrating still another example of the present processing method.

FIG. 9 is a timing chart illustrating still another example of the present processing method. The example of FIG. 9 is different from the example described in FIG. 4 at timing when the electric pulses P2 and P3 of the second and third source RF signals are turned on or off. That is, in the example illustrated in FIG. 9, the electric pulses P2 and P3 of the second and third source RF signals are turned off at time which is later by Δt than time t1 in which the electric pulse P1 of the bias DC signal is turned on. That is, the periods Tb1 and Tc1 in which the electric pulses P2 and P3 of the second and third source RF signals are turned off are temporally later by Δt than the period Ta1 in which the electric pulse P1 of the bias DC signal is turned on. Similarly, the electric pulses P2 and P3 of the second and third source RF signals are turned on at time which is later by Δt than time t2 in which the electric pulse P1 of the bias DC signal is turned off. That is, the periods Tb2 and Tc2 in which the electric pulses P2 and P3 of the second and third source RF signals are turned on are temporally later by Δt than the period Ta2 in which the electric pulse P1 of the bias DC signal is turned off.

As described above, the example illustrated in FIG. 9 matches the example illustrated in FIG. 4 in that the lengths of the period PDb and the period PDc are equal to the period PDa. Further, the example illustrated in FIG. 9 matches the example illustrated in FIG. 4 in that the duty ratios of the second and third source RF signals are equal to the duty ratio of the bias DC signal. On the other hand, the example illustrated in FIG. 9 is different from the example illustrated in FIG. 4 in that the periods Tb1 and Tb2 and the periods Tc1 and Tc2 are later by Δt than the periods Ta1 and Ta2, respectively.

Figure 10:
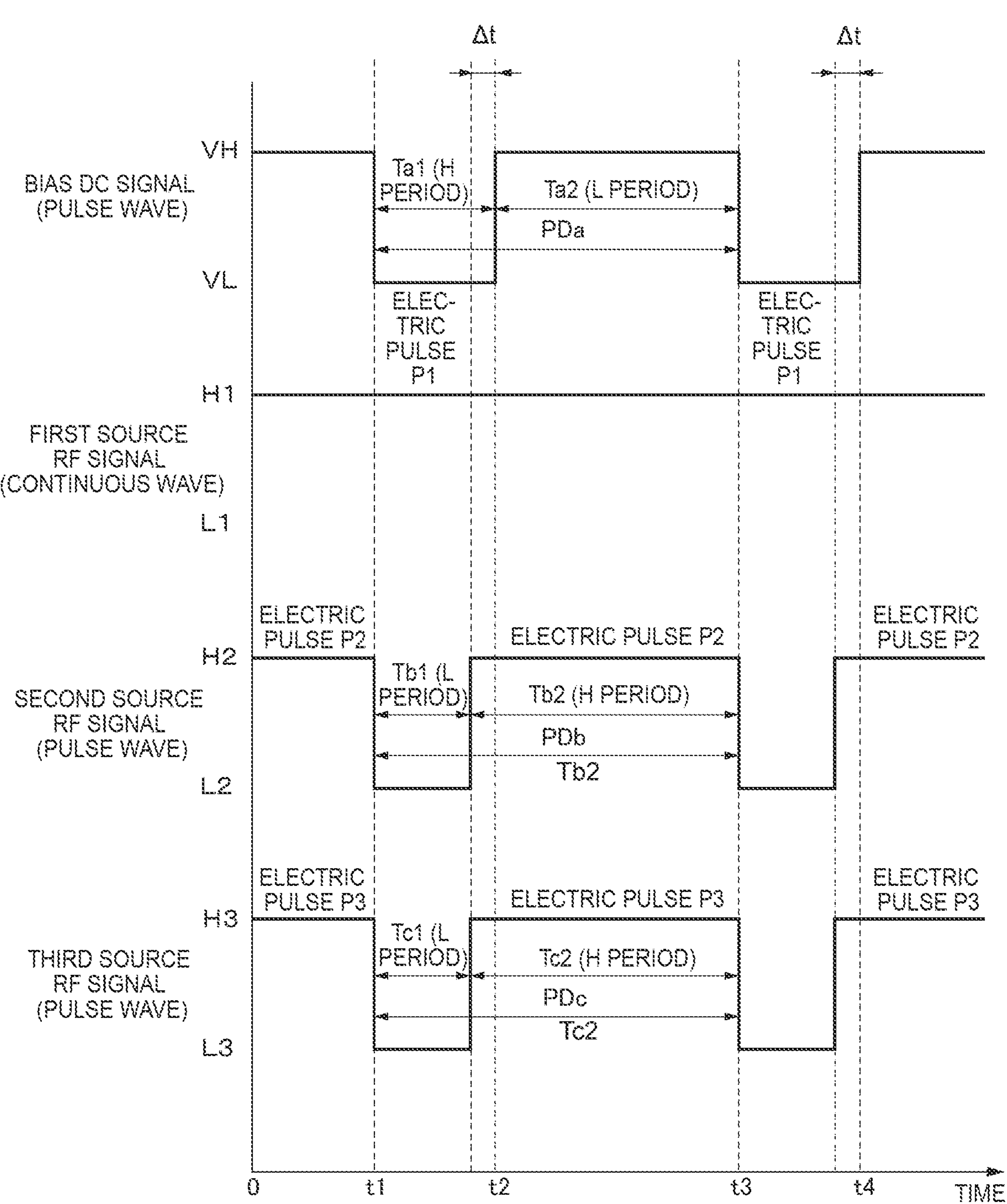
FIG. 10 is a timing chart illustrating still another example of the present processing method.

FIG. 10 is a timing chart illustrating still another example of the present processing method. The example illustrated in FIG. 10 is different from the example described in FIG. 4 at timings when the electric pulses P2 and P3 of the second and third source RF signals are turned on. That is, in the example illustrated in FIG. 10, the electric pulses P2 and P3 of the second and third source RF signals are turned on at time which is earlier by Δt than time t2 in which the electric pulse P1 of the bias DC signal is turned off.

As described above, the example illustrated in FIG. 10 matches the example illustrated in FIG. 4 in that the lengths and the start and end timings of the period PDb and the period PDc are equal to the length and the start and end timings of the period PDa. On the other hand, the example illustrated in FIG. 10 is different from the example illustrated in FIG. 4 in that the duty ratios of the second and third source RF signals are different from the duty ratio of the bias DC signal.

Figure 11:
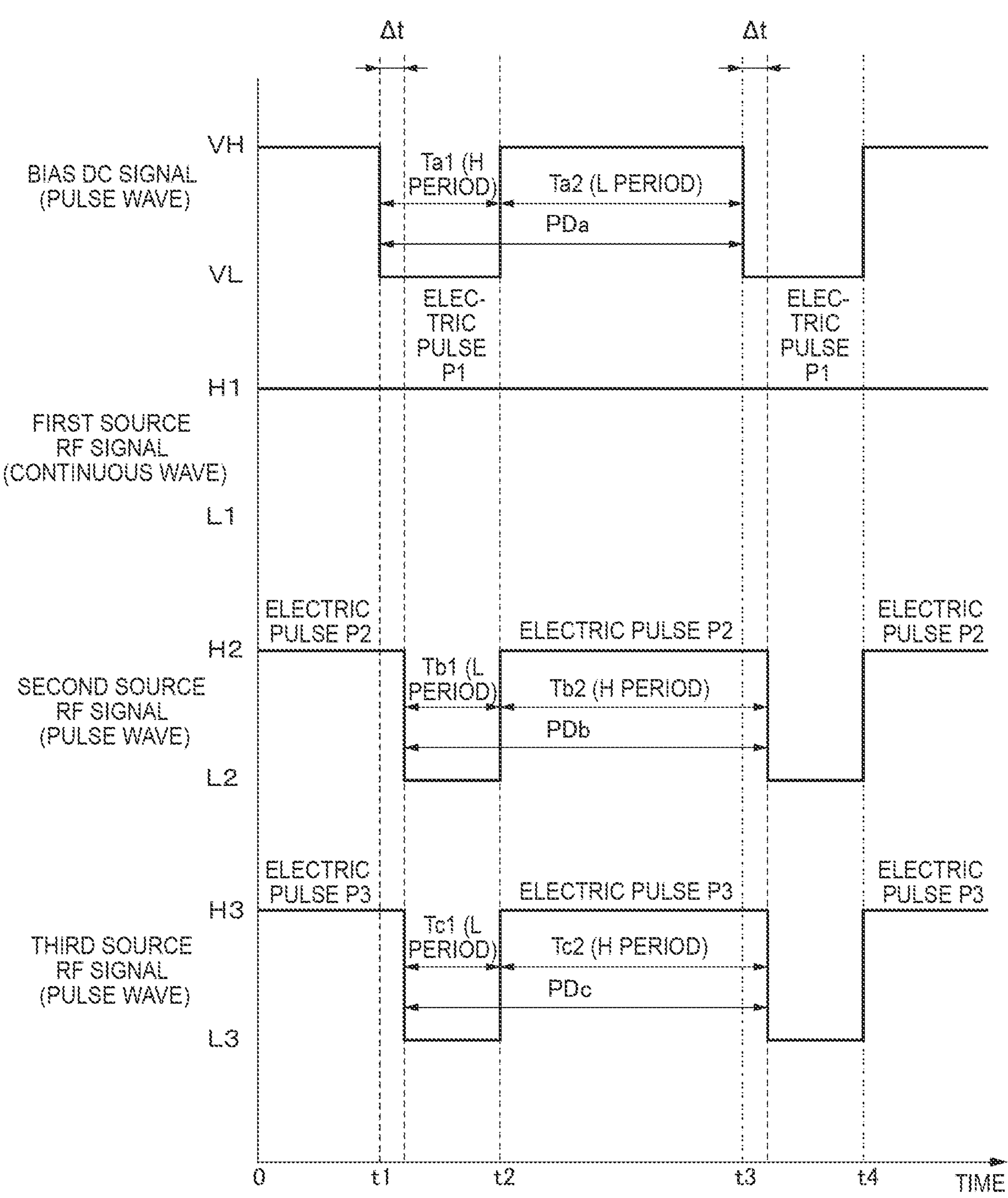
FIG. 11 is a timing chart illustrating still another example of the present processing method.

FIG. 11 is a timing chart illustrating still another example of the present processing method. The example illustrated in FIG. 11 is different from the example described in FIG. 4 in a timing when the electric pulses P2 and P3 of the second and third source RF signals are turned off. That is, in the example illustrated in FIG. 11, the electric pulses P2 and P3 of the second and third source RF signals are turned off at time which is later by Δt than time t1 in which the electric pulse P1 of the bias DC signal is turned on. Further, the electric pulses P2 and P3 of the second and third source RF signals are turned on at time t2 in which the electric pulse P1 of the bias DC signal is turned off.

As described above, the example illustrated in FIG. 11 matches the example illustrated in FIG. 4 at a timing when the electric pulses P2 and P3 of the second and third source RF signals are turned on. Further, the example illustrated in FIG. 11 matches the example illustrated in FIG. 4 in that the lengths of the period PDb and the period PDc are equal to the period PDa. On the other hand, the example illustrated in FIG. 11 is different from the example illustrated in FIG. 4 in that the timing when the period Tb1 and the period Tc1 start is later by Δt than the timing when the period Ta1 starts. Further, the example illustrated in FIG. 11 is different from the example illustrated in FIG. 4 in that the timing when the period Tb2 and the period Tc2 end is later by Δt than the timing when the period Ta2 ends. Further, the example illustrated in FIG. 11 is different from the example illustrated in FIG. 4 in that the duty ratios of the second and third source RF signals are different from the duty ratio of the bias DC signal.

Figure 12:
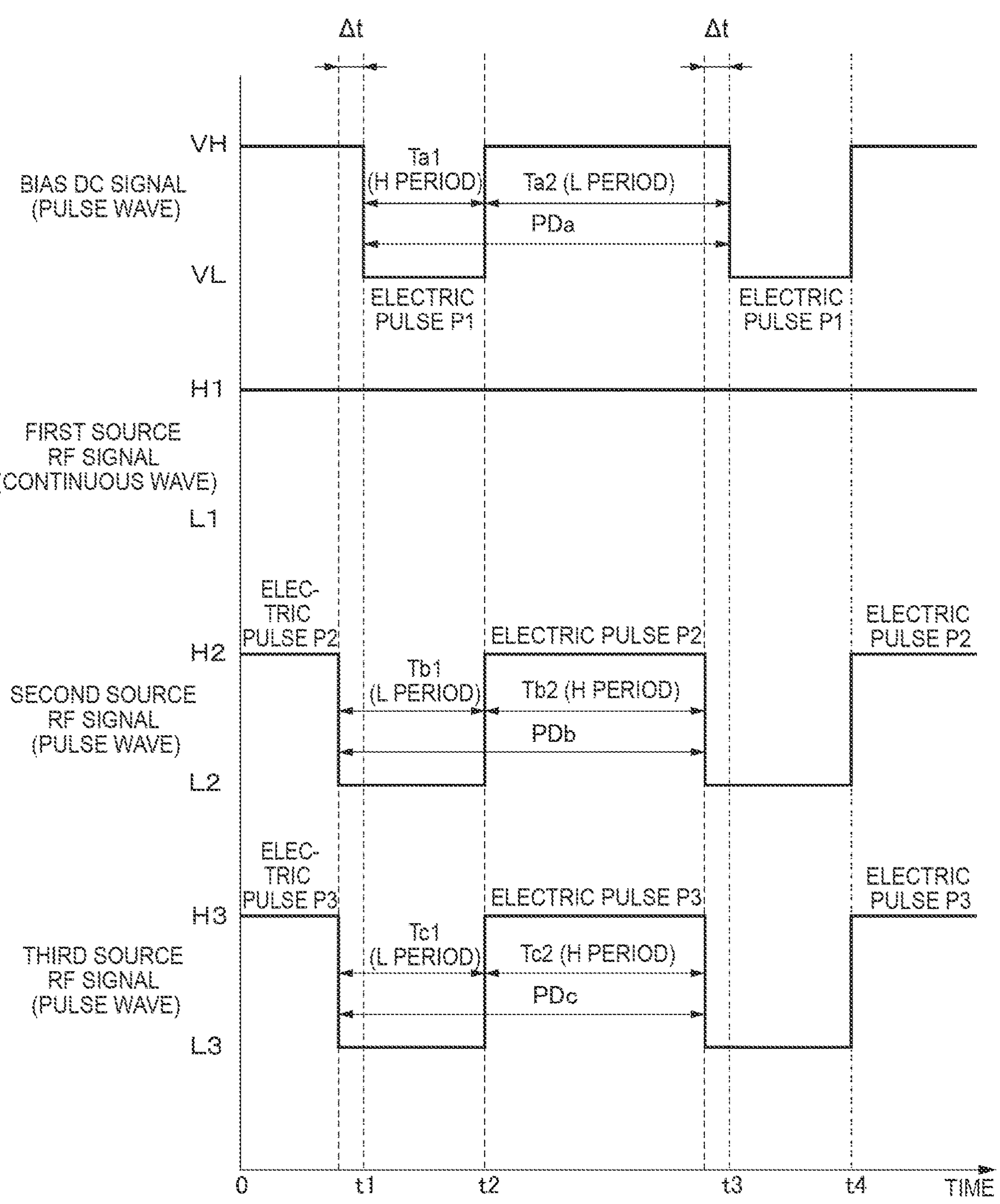
FIG. 12 is a timing chart illustrating still another example of the present processing method.

FIG. 12 is a timing chart illustrating still another example of the present processing method. The example illustrated in FIG. 12 is different from the example described in FIG. 4 in a timing when the electric pulses P2 and P3 of the second and third source RF signals are turned off. That is, in the example illustrated in FIG. 12, the electric pulses P2 and P3 of the second and third source RF signals are turned off at time which is earlier by Δt than time t1 in which the electric pulse P1 of the bias DC signal is turned on. Further, the electric pulses P2 and P3 of the second and third source RF signals are turned on at time t2 in which the electric pulse P1 of the bias DC signal is turned off. That is, the periods Tb1 and Tc1 in which the electric pulses P2 and P3 of the second and third source RF signals are turned off start temporally advanced by Δt from the period Ta1 in which the bias DC signal is turned on, and end at the same time as the period Ta1. Further, the electric pulses P2 and P3 of the second and third source RF signals are turned off at time which is earlier by Δt than time t3 in which the electric pulse P1 of the bias DC signal is turned on.

As described above, the example illustrated in FIG. 12 matches the example illustrated in FIG. 4 at the timing when the electric pulses P2 and P3 of the second and third source RF signals are turned on. Further, the example illustrated in FIG. 12 matches the example illustrated in FIG. 4 in that the lengths of the period PDb and the period PDc are equal to the period PDa. On the other hand, the example illustrated in FIG. 12 is different from the example illustrated in FIG. 4 in that the timing when the period Tb1 and the period Tc1 start are temporally earlier than the period Ta1 by Δt. Further, the example illustrated in FIG. 12 is different from the example illustrated in FIG. 4 in that the timing when the period Tb2 and the period Tc2 end is earlier by Δt than the timing when the period Ta2 ends. Further, the example illustrated in FIG. 12 is different from the example illustrated in FIG. 4 in that the duty ratios of the second and third source RF signals are different from the duty ratio of the bias DC signal.

Figure 13:
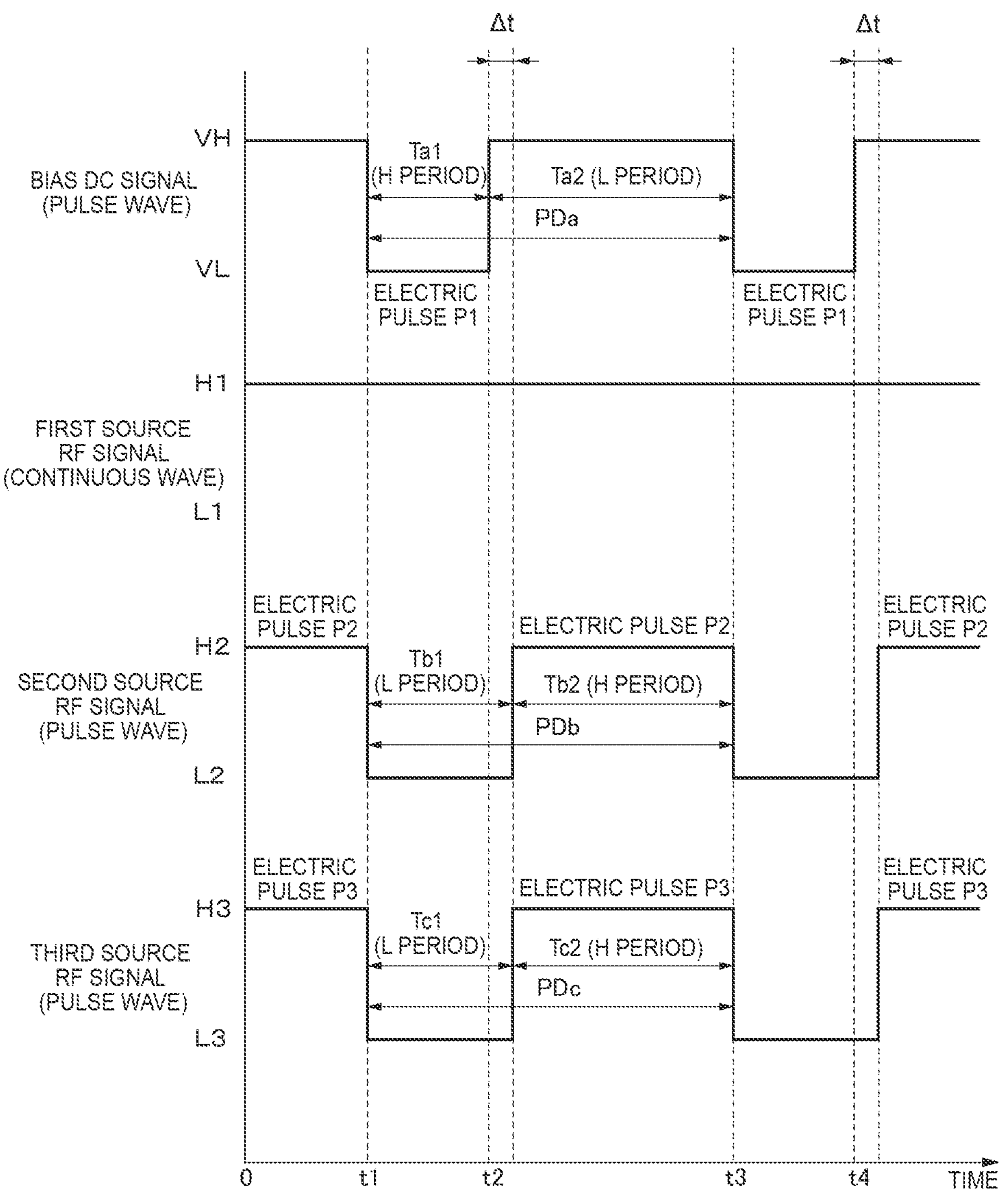
FIG. 13 is a timing chart illustrating still another example of the present processing method.

FIG. 13 is a timing chart illustrating still another example of the present processing method. The example illustrated in FIG. 13 is different from the example described in FIG. 4 at a timing when the electric pulses P2 and P3 of the second and third source RF signals are turned on. That is, in the example illustrated in FIG. 13, the electric pulses P2 and P3 of the second and third source RF signals are turned on at time which is later by Δt than time t2 in which the electric pulse P1 of the bias DC signal is turned off. That is, the periods Tb1 and Tc1, in which the electric pulses P2 and P3 of the second and third source RF signals are turned off, start at the same time as the period Ta1 and end temporally later by Δt than the period Ta1 in which the electric pulse P1 of the bias DC signal is turned on. Further, the electric pulses P2 and P3 of the second and third source RF signals are turned off at time t3 in which the electric pulse P1 of the bias DC signal is turned on.

As described above, the example illustrated in FIG. 13 matches the example illustrated in FIG. 4 at the timing when the electric pulses P2 and P3 of the second and third source RF signals are turned off. Further, the example illustrated in FIG. 13 matches the example illustrated in FIG. 4 in that the lengths and the start and end timings of the period PDb and the period PDc are equal to the length and the start and end timings of the period PDa. On the other hand, the example illustrated in FIG. 13 is different from the example illustrated in FIG. 4 in that the duty ratios of the second and third source RF signals are different from the duty ratio of the bias DC signal.

Figure 14:
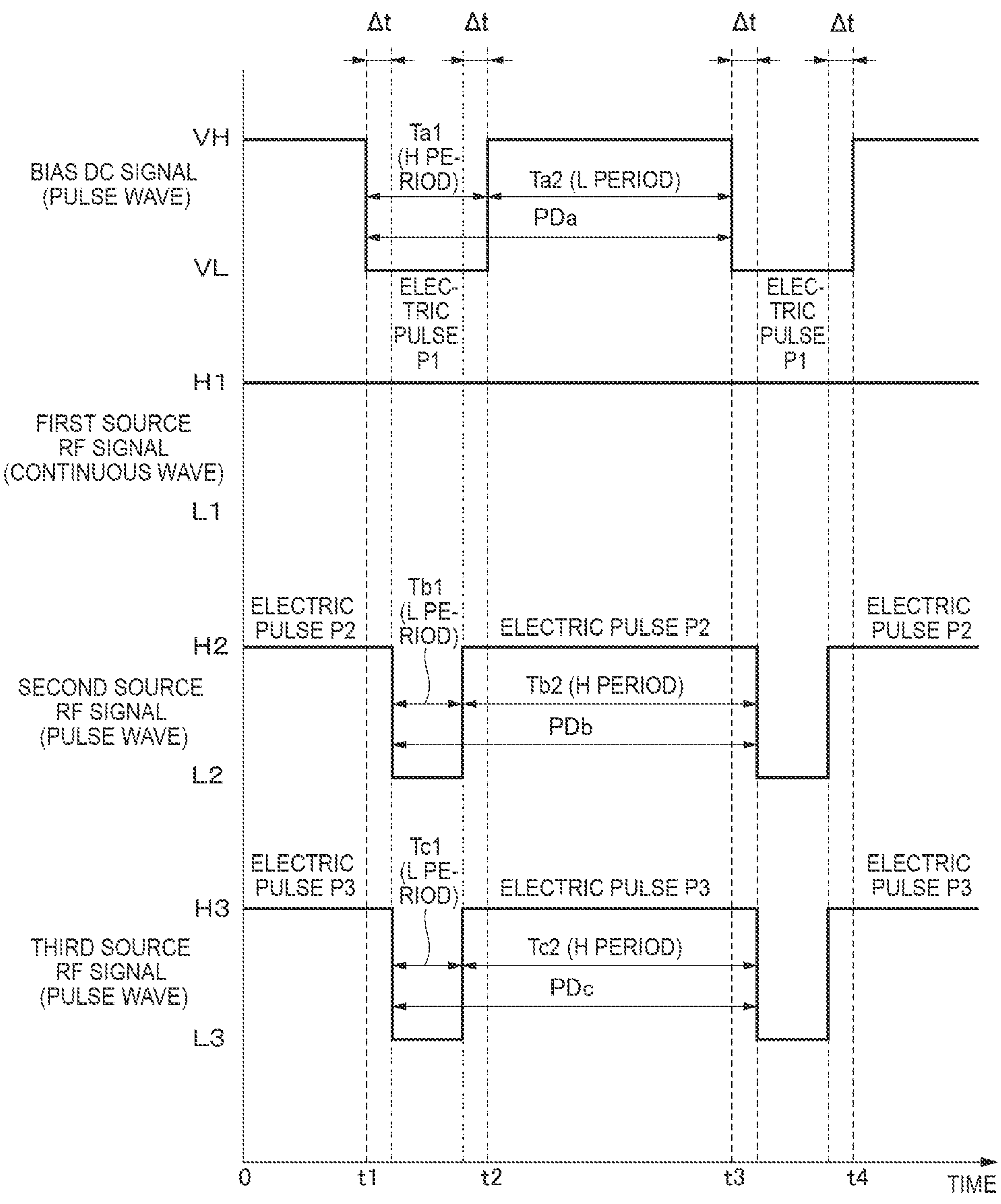
FIG. 14 is a timing chart illustrating still another example of the present processing method.

FIG. 14 is a timing chart illustrating still another example of the present processing method. The example illustrated in FIG. 14 is different from the example described in FIG. 4 at a timing when the electric pulses P2 and P3 of the second and third source RF signals are turned on and off. That is, in the example illustrated in FIG. 14, the electric pulses P2 and P3 of the second and third source RF signals are turned off at time which is later by Δt than time t1 in which the electric pulse P1 of the bias DC signal is turned on, and are turned on at time which is earlier by Δt than time t2 in which the electric pulse P1 of the bias DC signal is turned off. That is, the periods Tb1 and Tc1 in which the electric pulses P2 and P3 of the second and third source RF signals are turned off start later by Δt than the period Ta1 and end earlier by Δt. Further, the electric pulses P2 and P3 of the second and third source RF signals are turned off at time which is later by Δt than time t3 in which the electric pulse P1 of the bias DC signal is turned on.

As described above, the example illustrated in FIG. 14 matches the example illustrated in FIG. 4 in that the lengths of the period PDb and the period PDc are equal to the length of the period PDa. On the other hand, the example illustrated in FIG. 14 is different from the example illustrated in FIG. 4 in that the timings when the electric pulses P2 and P3 of the second and third source RF signals are turned on and off are different. Further, the example illustrated in FIG. 14 is different from the example illustrated in FIG. 4 in that the duty ratios of the second and third source RF signals are different from the duty ratio of the bias DC signal.

Figure 15:
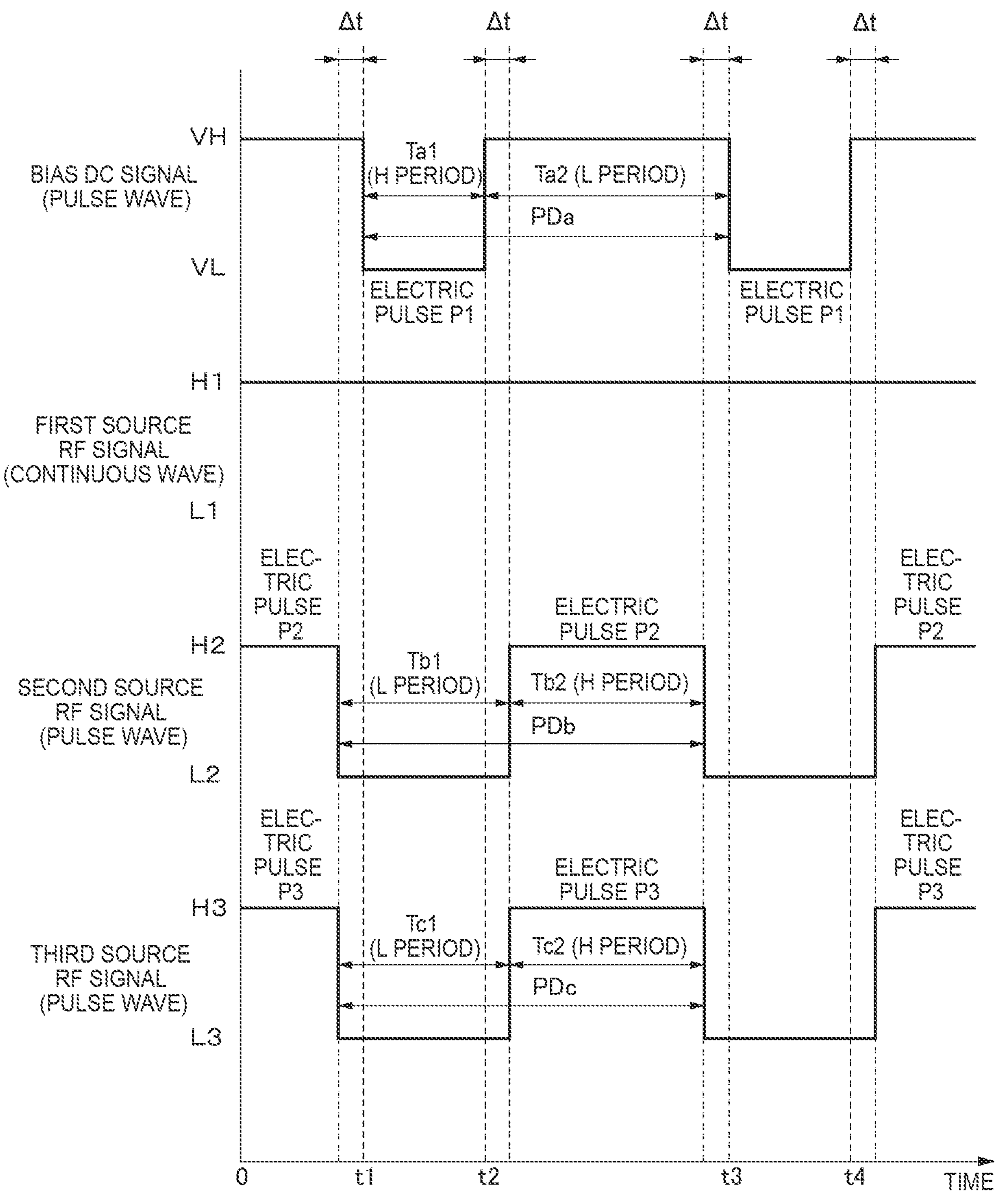
FIG. 15 is a timing chart illustrating still another example of the present processing method.

FIG. 15 is a timing chart illustrating still another example of the present processing method. The example illustrated in FIG. 15 is different from the example described in FIG. 4 at a timing when the electric pulses P2 and P3 of the second and third source RF signals are turned on and off. That is, in the example illustrated in FIG. 15, the electric pulses P2 and P3 of the second and third source RF signals are turned off at time which is earlier by Δt than time t1 in which the electric pulse P1 of the bias DC signal is turned on, and are turned on at time which is later by Δt than time t2 in which the electric pulse P1 of the bias DC signal is turned off. That is, the periods Tb1 and Tc1 in which the electric pulses P2 and P3 of the second and third source RF signals are turned off start earlier than the period Ta1 by Δt and end later by Δt. Further, the electric pulses P2 and P3 of the second and third source RF signals are turned off at time which is earlier by Δt than time t3 in which the electric pulse P1 of the bias DC signal is turned on.

As described above, the example illustrated in FIG. 15 matches the example illustrated in FIG. 4 in that the lengths of the period PDb and the period PDc are equal to the length of the period PDa. On the other hand, the example illustrated in FIG. 15 is different from the example illustrated in FIG. 4 in that the timings when the electric pulses P2 and P3 of the second and third source RF signals are turned on and off are different. Further, the example illustrated in FIG. 15 is different from the example illustrated in FIG. 4 in that the duty ratios of the second and third source RF signals are different from the duty ratio of the bias DC signal.

In the example illustrated in FIGS. 8 to 15, in addition to the effect of the example illustrated in FIG. 4, it is possible to control a timing when the electric pulses P2 and P3 of the second and third source RF signals are turned on or off based on a timing when the electric pulse P1 of the bias DC signal is turned on or off. That is, according to the timing when the reflection of the first source RF signal and the turning on or off of the electric pulse P1 of the bias DC signal affect the plasma density, it is possible to appropriately control the timing when the electric pulses P2 and P3 of the second and third source RF signals are turned on or off. Therefore, it is possible to improve the generation efficiency of the plasma by the source RF signal. Accordingly, it is possible to control the plasma density and/or the electron temperature.

Figure 16:
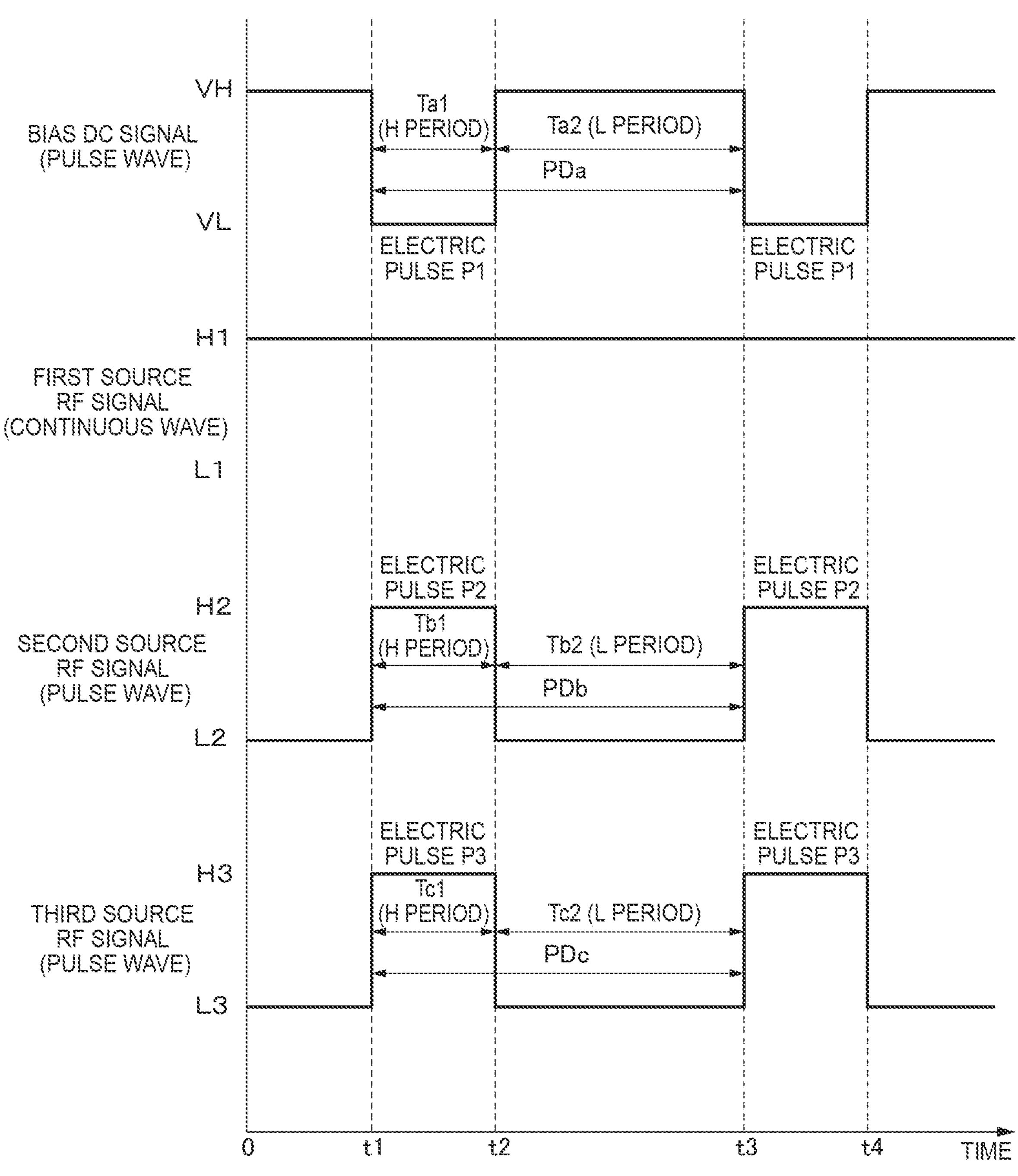
FIG. 16 is a timing chart illustrating still another example of the present processing method.

FIG. 16 is a timing chart illustrating still another example of the present processing method. In the example illustrated in FIG. 16, the phases of the second and third source RF signals are opposite as compared with the example described in FIG. 4. That is, in the example illustrated in FIG. 16, the electric pulses P2 and P3 of the second and third source RF signals are also turned on or off at the timing when the electric pulse P1 of the bias DC signal is turned on or off.

At time t1, the electric pulse P1 of the bias DC signal is turned on, and the electric pulses P2 and P3 of the second and third source RF signals are turned on. Then, when the electric pulse P1 of the bias DC signal is turned off at time t2 in which the period Ta1 (Tb1, Tc1) elapses from time t1, the electric pulses P2 and P3 of the second and third source RF signals are turned off. At time t3 in which the period Ta2 (Tb2, Tc2) elapses from time t2, the period PDa (PDb, PDc) which is one cycle of the bias DC signal and the second and third source RF signals ends. Further, at time t3, next cycles of the bias DC signal and the second and third source RF signals start.

As described above, in the example illustrated in FIG. 16, in the period Ta1 in which the electric pulse P1 of the bias DC signal is turned on, the synthesized wave of the first, second, and/or third source RF signals is supplied to the substrate support 11, together with the electric pulse P1. That is, in the period Ta1 in which the electric pulse P1 of the bias DC signal is turned on, that is, at a timing when the active species in the plasma are attracted to the substrate W by the electric pulse P1, the first source RF signal is superimposed on the substrate support 11 and the second and third source RF signals are supplied. Accordingly, it is possible to increase the density of the plasma at a timing when the active species in the plasma are attracted to the substrate W. Further, it is possible to raise the electron temperature in the plasma. Further, in the example illustrated in FIG. 16, the synthesized wave of the first, second, and/or third source RF signals is supplied at the timing when the electric pulse P1 of the bias DC signal is turned on. Here, the first, second, and/or third source RF signals may have different frequencies, respectively. That is, it is possible to supply the source RF signal including a plurality of frequencies to the substrate support 11 at the timing when the electric pulse P1 of the bias DC signal is turned on. Accordingly, it is possible to suppress the reflection of the synthesized wave of the source RF signal at the timing when the electric pulse P1 of the bias DC signal is turned on. Therefore, a plasma is easily formed. Further, in the example illustrated in FIG. 16, even when the impedance of the first, second, and third source RF signals changes with respect to the synthesized wave, impedance matching may be obtained in any of the first, second, and third source RF signals. Therefore, for example, even when the impedance to the synthesized wave changes at the timing when the electric pulse P1 of the bias DC signal is turned on and the reflection amount of the synthesized wave changes, it is possible to suppress the change amount.

In the example illustrated in FIG. 16 (and FIGS. 17 to 24), as an example, in a part of the period (that is, period Ta2) in which the electric pulse P1 of the bias DC signal is turned off, the power levels of the first, second, and third source RF signals may be L1, L2, and L3 at the same time. In this case, the power levels L1, L2, and L3 may all be zero. Further, as an example, in a part of the period (that is, period Ta2) in which the electric pulse P1 of the bias DC signal is turned off, a synthesized wave having a phase opposite to the phase of the first source RF signal may be generated by the second and/or third source RF signal, and may be superimposed on the first source RF signal. That is, the synthesized wave in which the power level of the synthesized wave of the first, second, and third source RF signals is zero may be generated by the second and third source RF signals.

Figure 17:
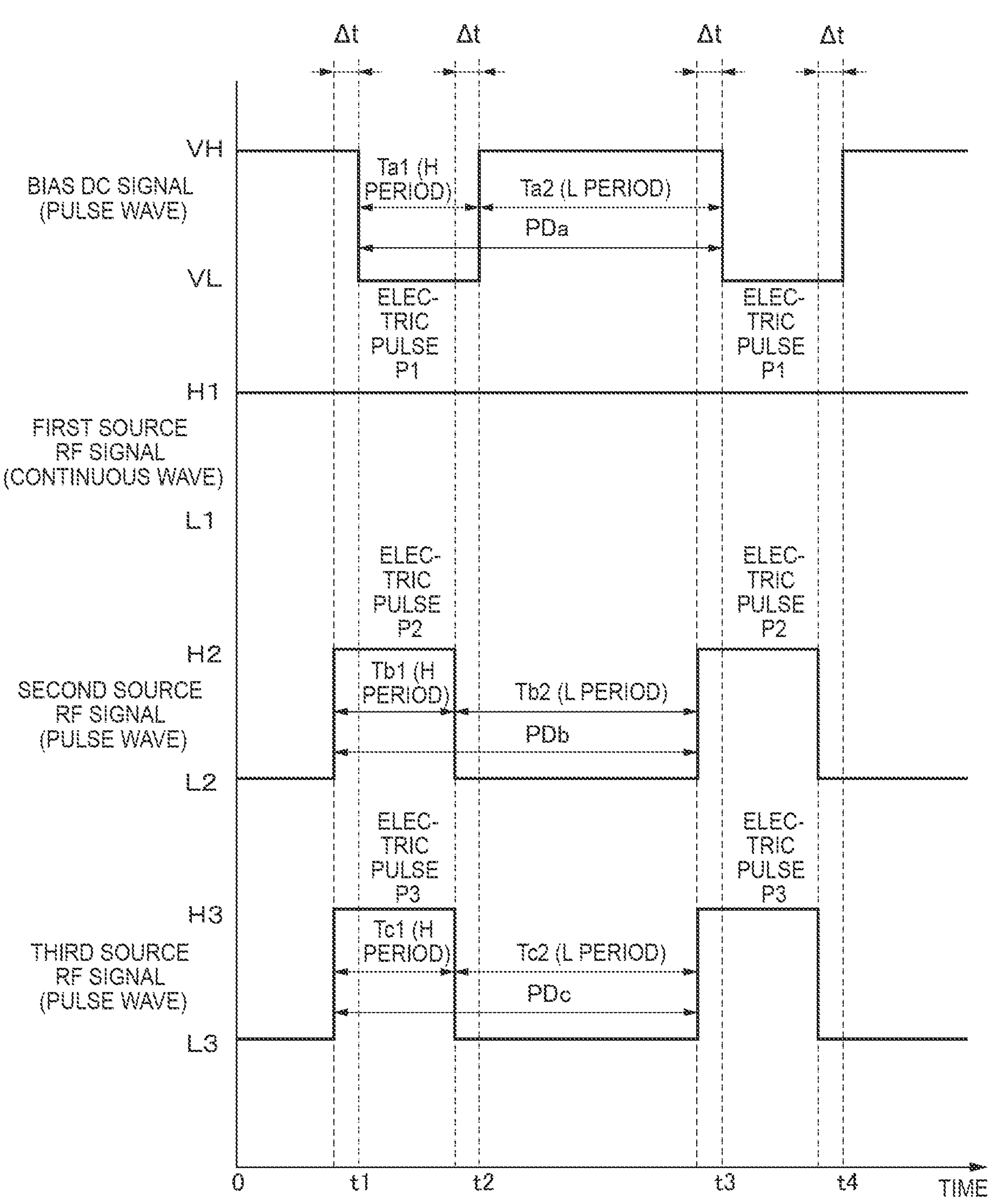
FIG. 17 is a timing chart illustrating still another example of the present processing method.

FIG. 17 is a timing chart illustrating still another example of the present processing method. In the example illustrated in FIG. 17, the phases of the second and third source RF signals are opposite to each other, as compared with the example described in FIG. 8.

In the example illustrated in FIG. 17, the electric pulses P2 and P3 of the second and third source RF signals are turned on at time which is earlier by Δt than time t1 in which the electric pulse P1 of the bias DC signal is turned on. That is, the periods Tb1 and Tc1 in which the electric pulses P2 and P3 of the second and third source RF signals are turned on are temporally advanced by Δt from the period Ta1 in which the electric pulse P1 of the bias DC signal is turned on. Similarly, the electric pulses P2 and P3 of the second and third source RF signals are turned off at time which is earlier by Δt than time t2 in which the electric pulse P1 of the bias DC signal is turned off. That is, the periods Tb2 and Tc2 in which the electric pulses P2 and P3 of the second and third source RF signals are turned on are temporally advanced by Δt from the period Ta2 in which the electric pulse P1 of the bias DC signal is turned on.

As described above, the example illustrated in FIG. 17 matches the example illustrated in FIG. 16 in that the lengths of the period PDb and the period PDc are equal to the length of the period PDa. Further, in the example illustrated in FIG. 17, the duty ratios of the second and third source RF signals match the duty ratio of the bias DC signal. On the other hand, the example illustrated in FIG. 8 is different from the example illustrated in FIG. 16 in that the periods Tb1 and Tb2 and the periods Tc1 and Tc2 are advanced by Δt from the periods Ta1 and Ta2, respectively.

Figure 18:
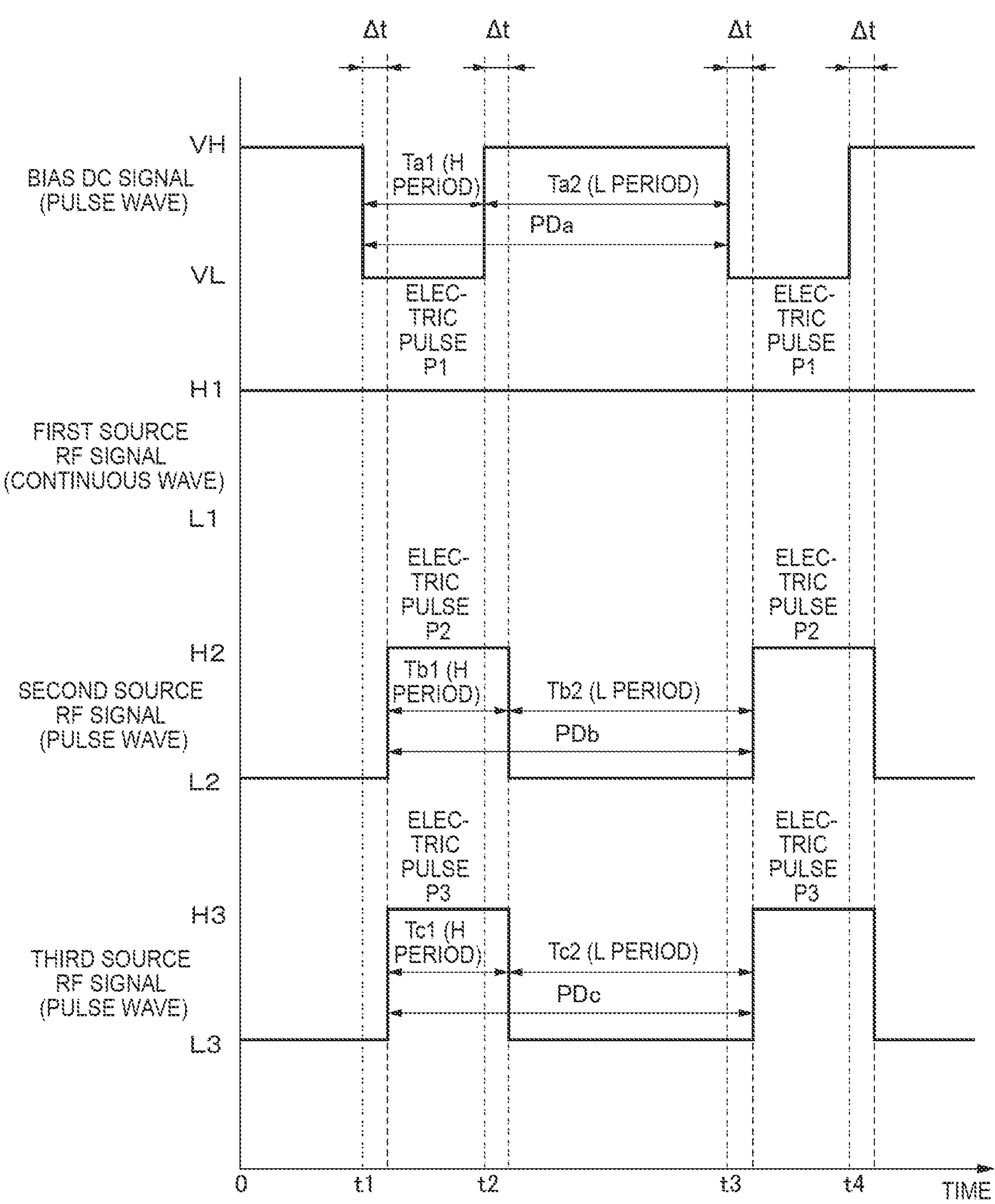
FIG. 18 is a timing chart illustrating still another example of the present processing method.

FIG. 18 is a timing chart illustrating still another example of the present processing method. In the example illustrated in FIG. 18, the phases of the second and third source RF signals are opposite to each other as compared with the example described in FIG. 9.

In the example illustrated in FIG. 18, the electric pulses P2 and P3 of the second and third source RF signals are turned off at time which is later by Δt than time t1 in which the electric pulse P1 of the bias DC signal is turned on. That is, the periods Tb1 and Tc1 in which the electric pulses P2 and P3 of the second and third source RF signals are turned on are temporally later by Δt than the period Ta1 in which the electric pulse P1 of the bias DC signal is turned on. Similarly, the electric pulses P2 and P3 of the second and third source RF signals are turned off at time which is later by Δt than time t2 in which the electric pulse P1 of the bias DC signal is turned off. That is, the periods Tb2 and Tc2 in which the electric pulses P2 and P3 of the second and third source RF signals are turned on are temporally later by Δt than the period Ta2 in which the electric pulse P1 of the bias DC signal is turned on.

As described above, the example illustrated in FIG. 18 matches the example illustrated in FIG. 16 in that the lengths of the period PDb and the period PDc are equal to the length of the period PDa. Further, the example illustrated in FIG. 18 matches the example illustrated in FIG. 16 in that the duty ratios of the second and third source RF signals are equal to the duty ratio of the bias DC signal. On the other hand, the example illustrated in FIG. 18 is different from the example illustrated in FIG. 16 in that the periods Tb1 and Tb2 and the periods Tc1 and Tc2 are later by Δt than the periods Ta1 and Ta2, respectively.

Figure 19:
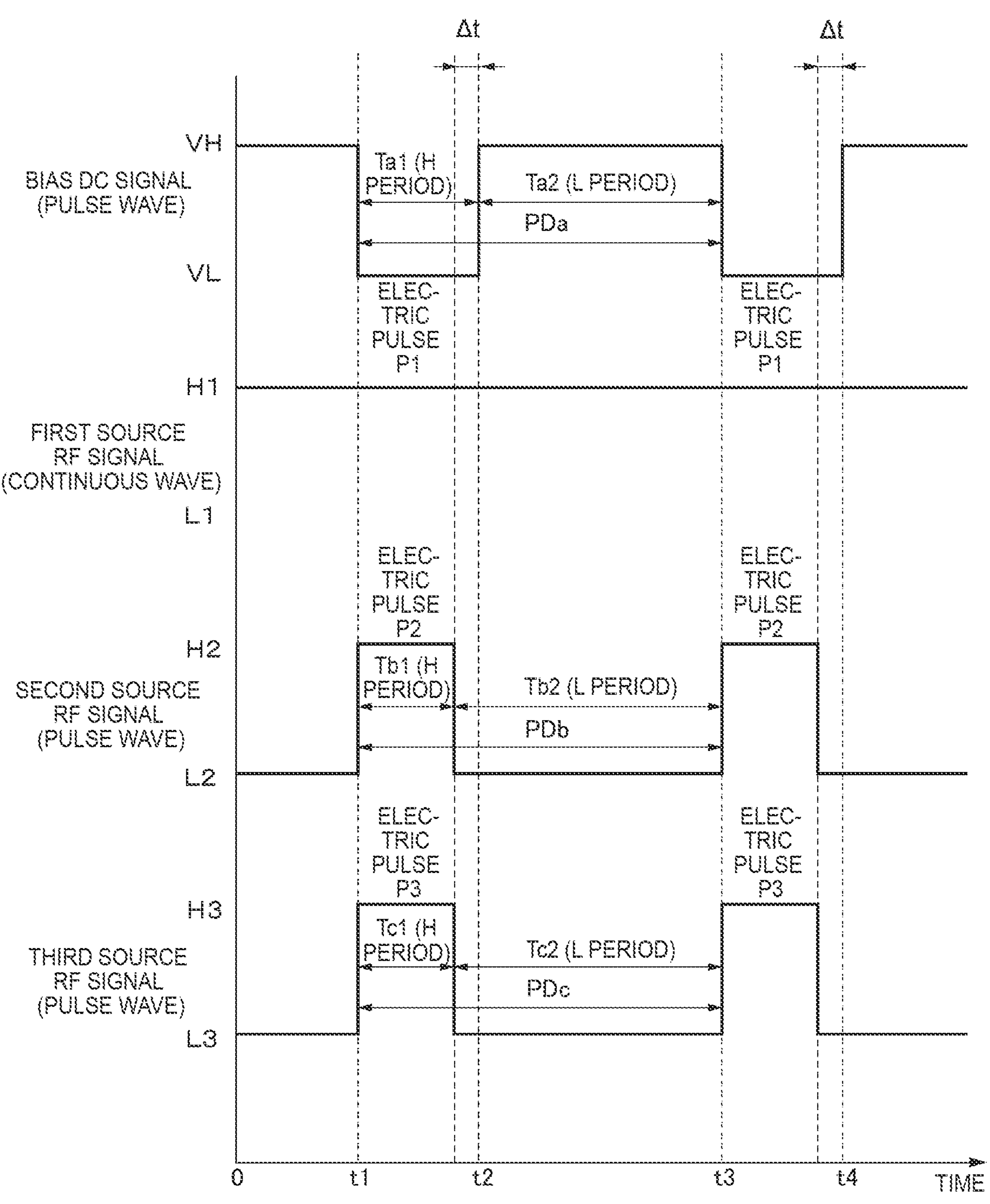
FIG. 19 is a timing chart illustrating still another example of the present processing method.

FIG. 19 is a timing chart illustrating still another example of the present processing method. In the example illustrated in FIG. 19, the phases of the second and third source RF signals are opposite to each other as compared with the example described in FIG. 10.

In the example illustrated in FIG. 19, the electric pulses P2 and P3 of the second and third source RF signals are turned on at time t1 in which the electric pulse P1 of the bias DC signal is turned on. Further, the electric pulses P2 and P3 of the second and third source RF signals are turned off at a time that is earlier by Δt than time t2 in which the electric pulse P1 of the bias DC signal is turned off.

As described above, the example illustrated in FIG. 19 matches the example illustrated in FIG. 16 in that the lengths and the start and end timings of the period PDb and the period PDc are equal to the length and the start and end timings of the period PDa. On the other hand, the example illustrated in FIG. 19 is different from the example illustrated in FIG. 16 in that the duty ratios of the second and third source RF signals are different from the duty ratio of the bias DC signal.

Figure 20:
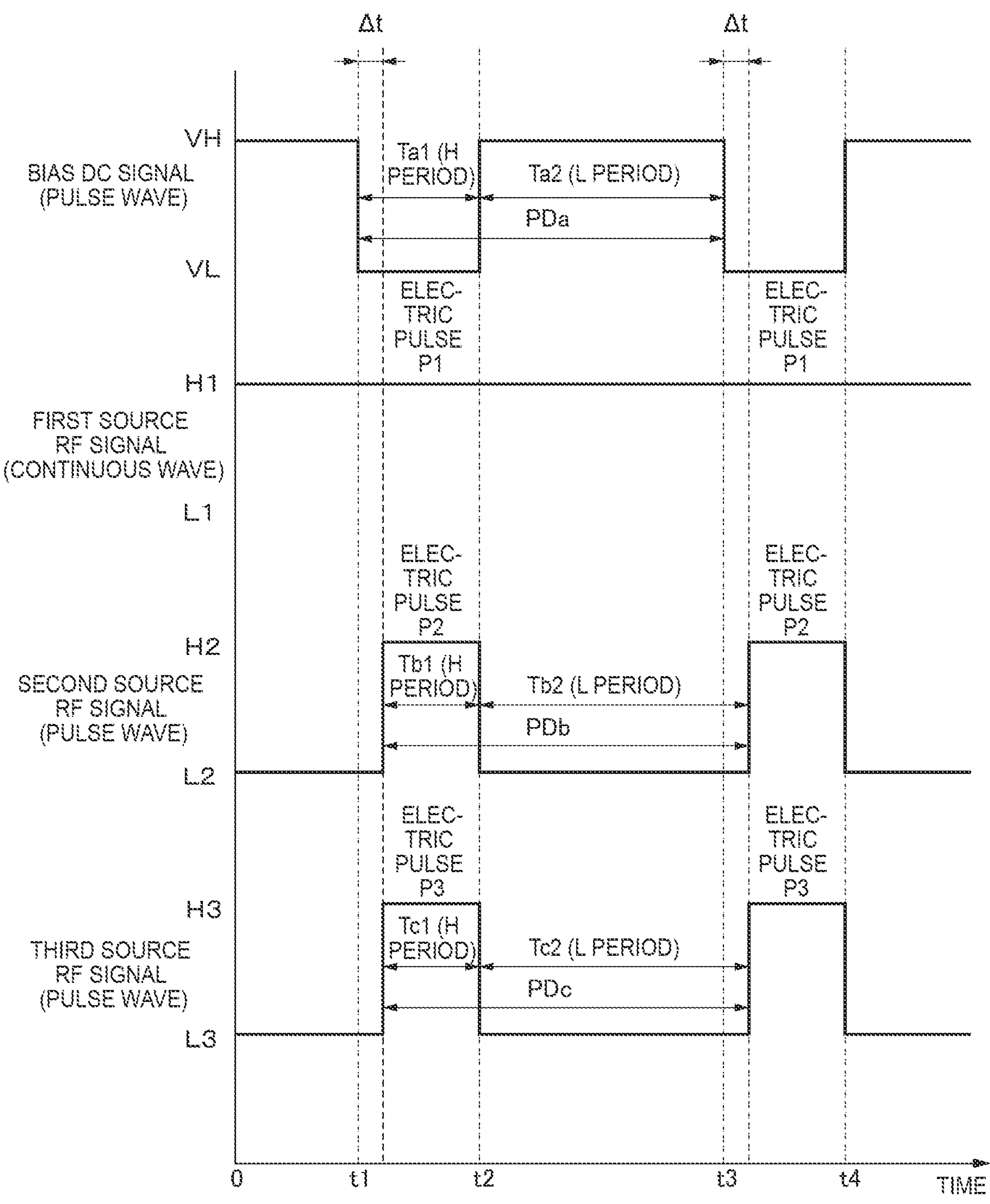
FIG. 20 is a timing chart illustrating still another example of the present processing method.

FIG. 20 is a timing chart illustrating still another example of the present processing method. In the example illustrated in FIG. 20, the phases of the second and third source RF signals are opposite to each other as compared with the example described in FIG. 11.

In the example illustrated in FIG. 20, the electric pulses P2 and P3 of the second and third source RF signals are turned on at time which is later by Δt than time t1 in which the electric pulse P1 of the bias DC signal is turned on. Further, the electric pulses P2 and P3 of the second and third source RF signals are turned off at time t2 in which the electric pulse P1 of the bias DC signal is turned off. Further, the electric pulses P2 and P3 of the second and third source RF signals are turned on at time which is later by Δt than time t3 in which the electric pulse P1 of the bias DC signal is turned on.

As described above, the example illustrated in FIG. 20 matches the example illustrated in FIG. 16 at the timing when the pulses of the second and third source RF signals are turned off. Further, the example illustrated in FIG. 20 matches the example illustrated in FIG. 16 in that the lengths of the period PDb and the period PDc are equal to the length of the period PDa. On the other hand, the example illustrated in FIG. 20 is different from the example illustrated in FIG. 16 in that the timing when the period Tb1 and the period Tc1 start is later by Δt than the timing when the period Ta1 starts. Further, the example illustrated in FIG. 20 is different from the example illustrated in FIG. 16 in that the timing when the period Tb2 and the period Tc2 end is later by Δt than the timing when the period Ta2 ends. Further, the example illustrated in FIG. 20 is different from the example illustrated in FIG. 16 in that the duty ratios of the second and third source RF signals are different from the duty ratio of the bias DC signal.

Figure 21:
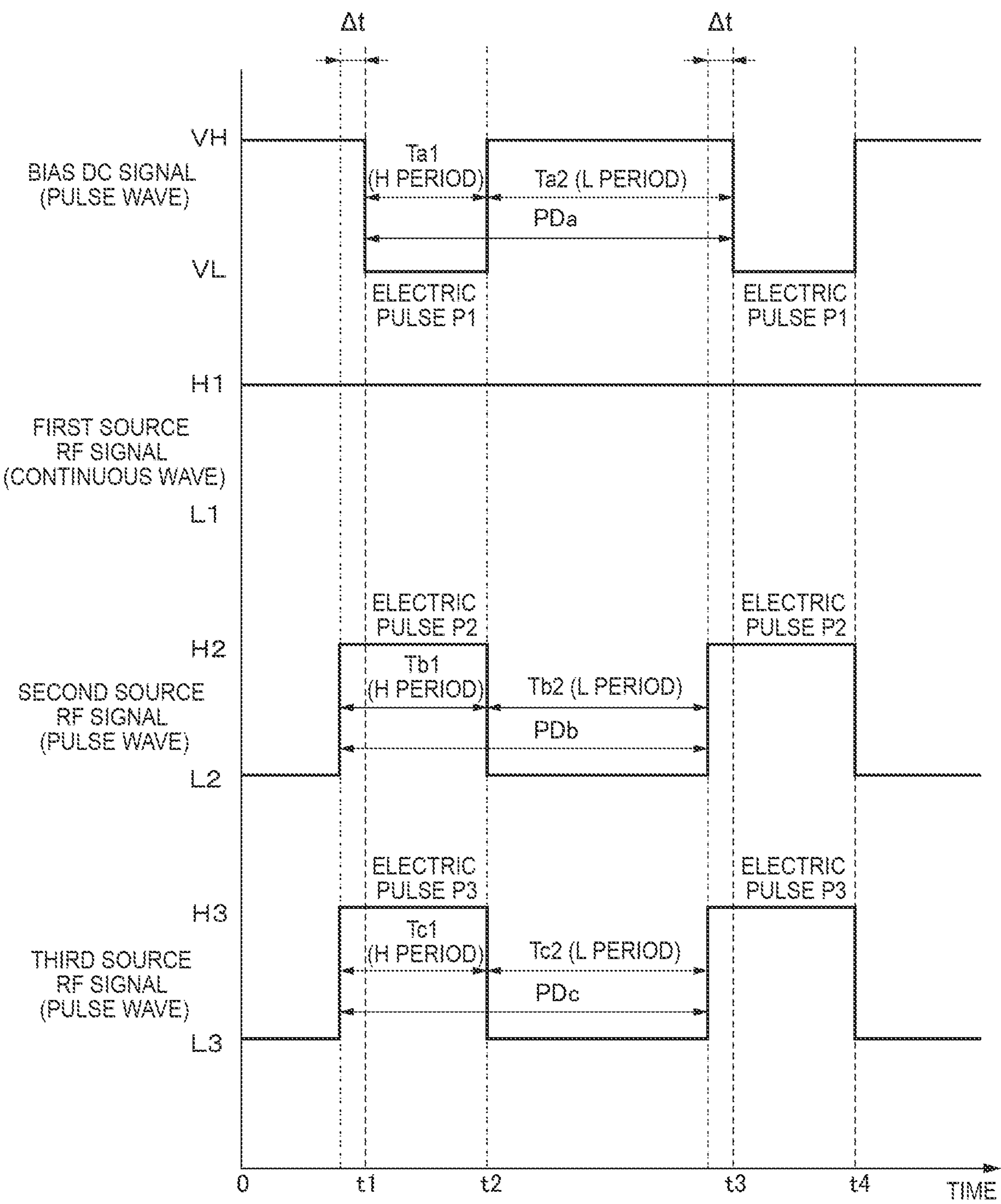
FIG. 21 is a timing chart illustrating still another example of the present processing method.

FIG. 21 is a timing chart illustrating still another example of the present processing method. In the example illustrated in FIG. 21, the phases of the second and third source RF signals are opposite to each other as compared with the example described in FIG. 12.

In the example illustrated in FIG. 21, the electric pulses P2 and P3 of the second and third source RF signals are turned on at time which is earlier by Δt than time t1 in which the electric pulse P1 of the bias DC signal is turned on. Further, the electric pulses P2 and P3 of the second and third source RF signals are turned off at time t2 in which the electric pulse P1 of the bias DC signal is turned off. Further, the electric pulses P2 and P3 of the second and third source RF signals are turned on at time which is earlier by Δt than time t3 in which the electric pulse P1 of the bias DC signal is turned on.

As described above, the example illustrated in FIG. 21 matches the example illustrated in FIG. 16 at the timing when the electric pulses P2 and P3 of the second and third source RF signals are turned off. Further, the example illustrated in FIG. 21 matches the example illustrated in FIG. 16 in that the lengths of the period PDb and the period PDc are equal to the length of the period PDa. On the other hand, the example illustrated in FIG. 21 is different from the example illustrated in FIG. 16 in that the timing when the period Tb1 and the period Tc1 start is earlier by Δt than the period Ta1. Further, the example illustrated in FIG. 21 is different from the example illustrated in FIG. 16 in that the timing when the period Tb2 and the period Tc2 end is earlier by Δt than the timing when the period Ta2 ends. Further, the example illustrated in FIG. 21 is different from the example illustrated in FIG. 16 in that the duty ratios of the second and third source RF signals are different from the duty ratio of the bias DC signal.

Figure 22:
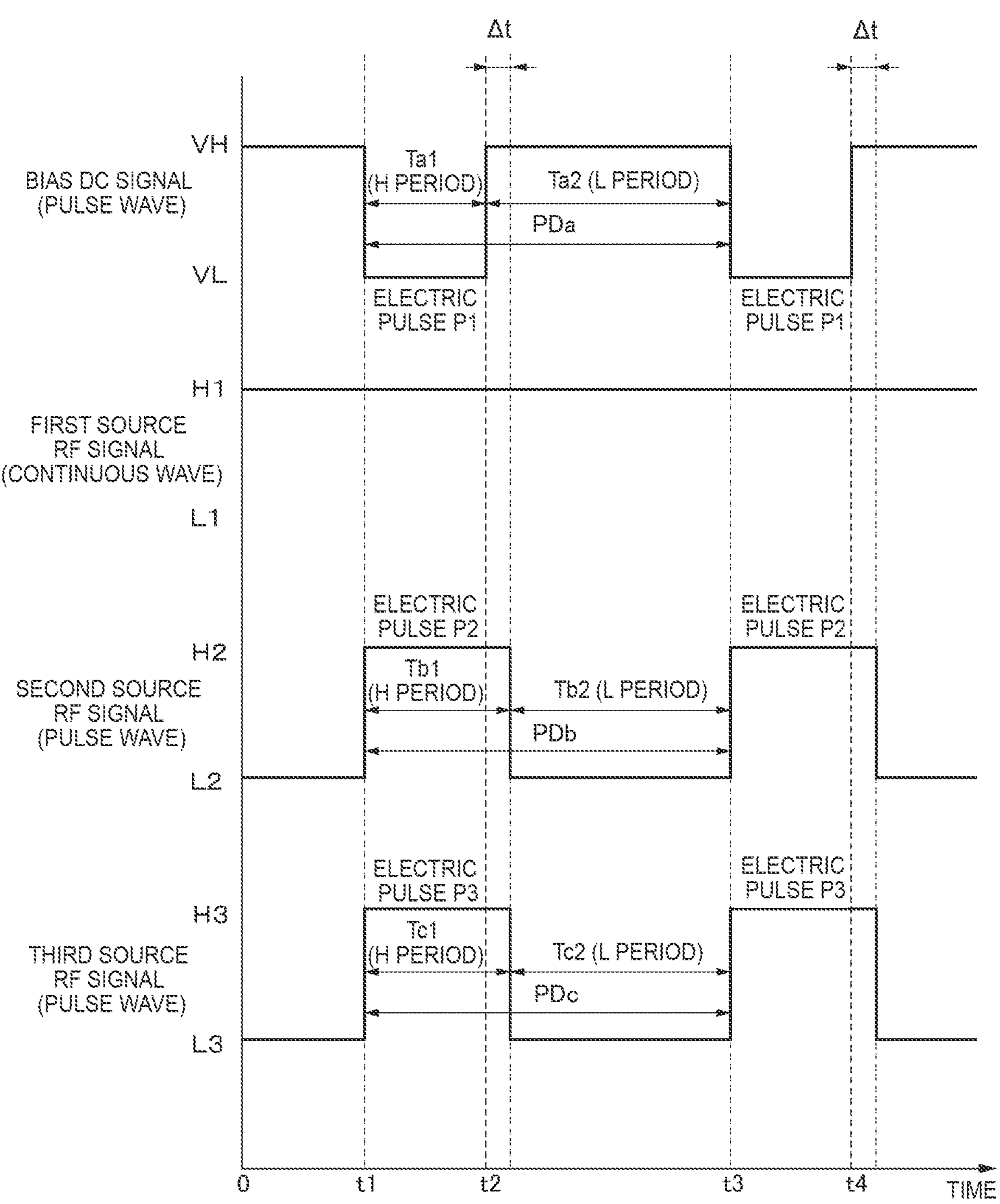
FIG. 22 is a timing chart illustrating still another example of the present processing method.

FIG. 22 is a timing chart illustrating still another example of the present processing method. In the example illustrated in FIG. 22, the phases of the second and third source RF signals are opposite to each other as compared with the example described in FIG. 13.

In the example illustrated in FIG. 22, the electric pulses P2 and P3 of the second and third source RF signals are turned off at time which is later by Δt than time t2 in which the electric pulse P1 of the bias DC signal is turned off. Further, the electric pulses P2 and P3 of the second and third source RF signals are turned on at time t3 in which the electric pulse P1 of the bias DC signal is turned on.

As described above, the example illustrated in FIG. 22 matches the example illustrated in FIG. 16 at the timing when the electric pulses P2 and P3 of the second and third source RF signals are turned off. Further, the example illustrated in FIG. 22 matches the example illustrated in FIG. 16 in that the lengths and the start and end timings of the period PDb and the period PDc are equal to the length and the start and end timings of the period PDa. On the other hand, the example illustrated in FIG. 22 is different from the example illustrated in FIG. 16 in that the timing when the period Tb1 and the period Tc1 end is later by Δt than the timing when the period Ta1 ends. Further, the example illustrated in FIG. 21 is different from the example illustrated in FIG. 16 in that the duty ratios of the second and third source RF signals are different from the duty ratio of the bias DC signal.

Figure 23:
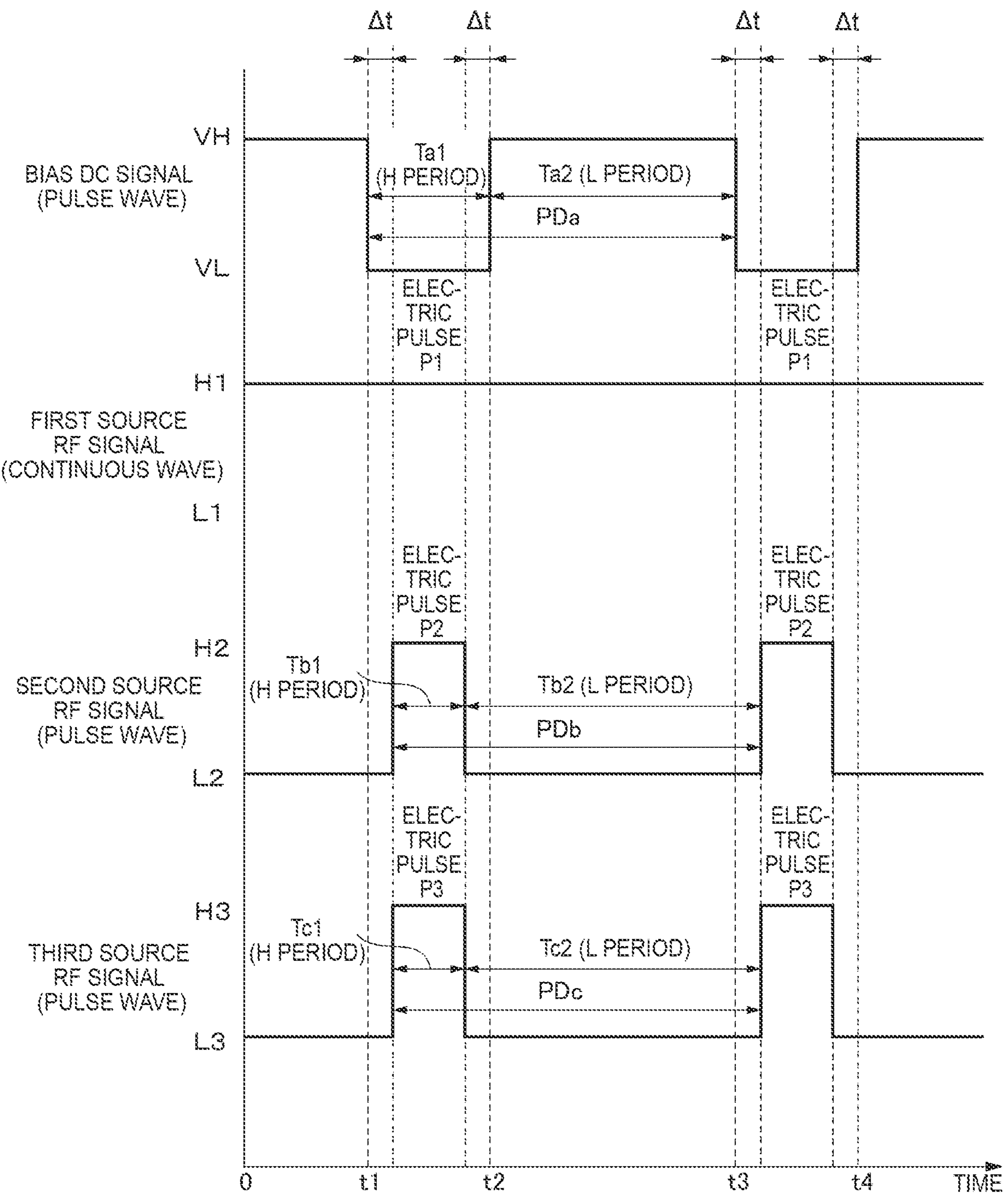
FIG. 23 is a timing chart illustrating still another example of the present processing method.

FIG. 23 is a timing chart illustrating still another example of the present processing method. In the example illustrated in FIG. 23, the phases of the second and third source RF signals are opposite to each other as compared with the example described in FIG. 16.

In the example illustrated in FIG. 23, the electric pulses P2 and P3 of the second and third source RF signals are turned on at time which is later by Δt than time t1 in which the pulse of the bias DC signal is turned on and are turned on at time which is earlier by Δt than time t2 in which the electric pulse P1 of the bias DC signal is turned off. That is, the periods Tb1 and Tc1 in which the electric pulses P2 and P3 of the second and third source RF signals are turned on start later by Δt than the period Ta1, and end earlier by Δt. Further, the electric pulses P2 and P3 of the second and third source RF signals are turned off at time which is later by Δt than time t3 in which the electric pulse P1 of the bias DC signal is turned on.

As described above, the example illustrated in FIG. 23 matches the example illustrated in FIG. 16 in that the lengths of the period PDb and the period PDc are equal to the length of the period PDa. On the other hand, the example illustrated in FIG. 23 is different from the example illustrated in FIG. 16 in that the timings when the electric pulses P2 and P3 of the second and third source RF signals are turned on and off are different. Further, the example illustrated in FIG. 23 is different from the example illustrated in FIG. 16 in that the duty ratios of the second and third source RF signals are different from the duty ratio of the bias DC signal.

Figure 24:
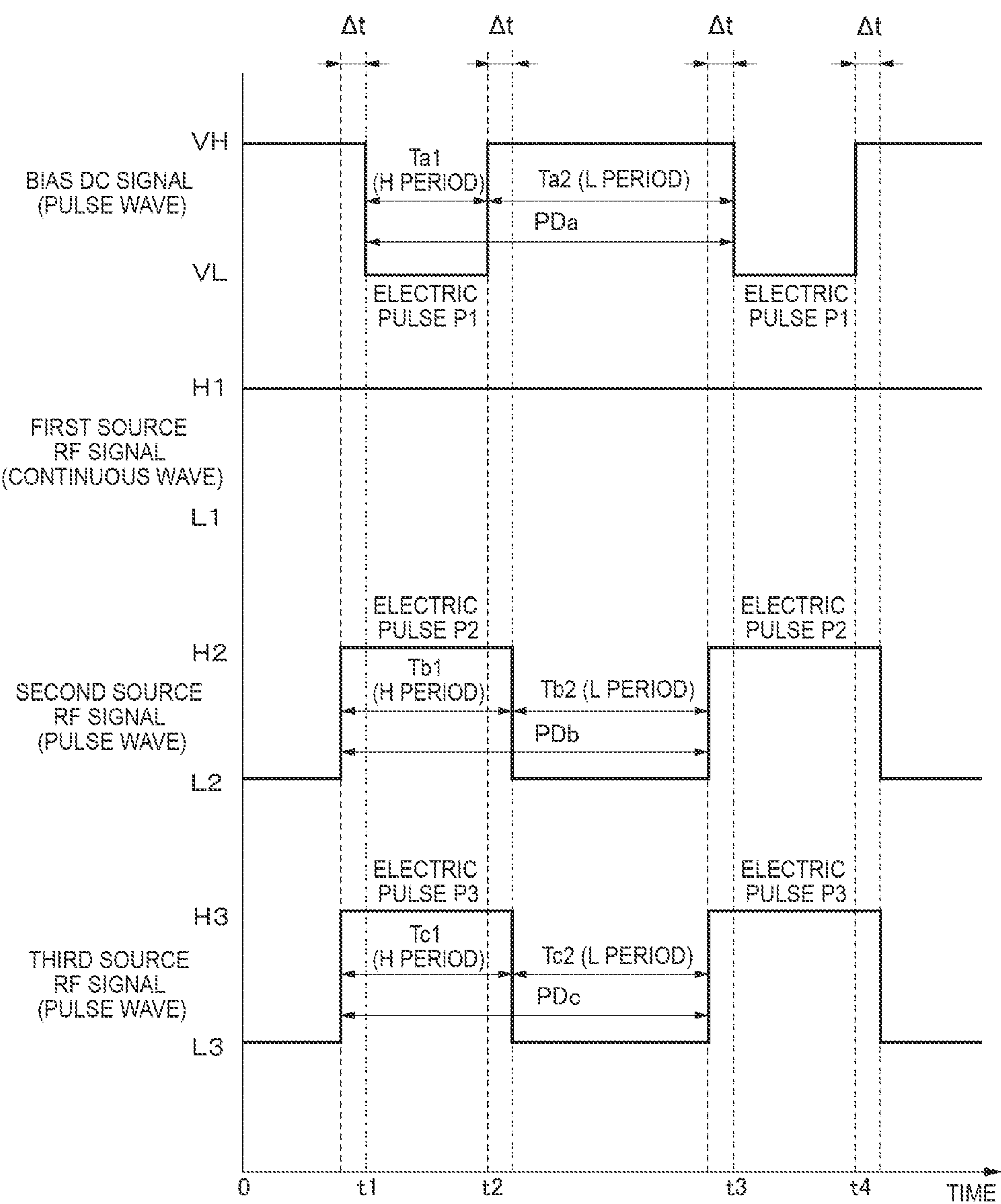
FIG. 24 is a timing chart illustrating still another example of the present processing method.

FIG. 24 is a timing chart illustrating still another example of the present processing method. In the example illustrated in FIG. 24, the phases of the second and third source RF signals are opposite to each other as compared with the example described in FIG. 15. That is, in the example illustrated in FIG. 24, the electric pulses P2 and P3 of the second and third source RF signals are turned on at time which is earlier by Δt than time t1 in which the electric pulse P1 of the bias DC signal is turned on and are turned off at time which is later by Δt than time t2 in which the electric pulse P1 of the bias DC signal is turned off. That is, the periods Tb1 and Tc1 in which the electric pulses P2 and P3 of the second and third source RF signals are turned on start earlier by Δt than the period Ta1, and end later by Δt. Further, the electric pulses P2 and P3 of the second and third source RF signals are turned on at time which is earlier by Δt than time t3 in which the electric pulse P1 of the bias DC signal is turned on As described above, the example illustrated in FIG. 24 matches the example illustrated in FIG. 16 in that the lengths of the period PDb and the period PDc are equal to the length of the period PDa. On the other hand, the example illustrated in FIG. 24 is different from the example illustrated in FIG. 16 in that the timings when the electric pulses P2 and P3 of the second and third source RF signals are turned on and off are different. Further, the example illustrated in FIG. 24 is different from the example illustrated in FIG. 16 in that the duty ratios of the second and third source RF signals are different from the duty ratio of the bias DC signal.

In the example illustrated in FIGS. 17 to 24, in addition to the effect of the example illustrated in FIG. 16, it is possible to control the timing when the electric pulses P2 and P3 of the second and third source RF signals are turned on or off based on the timing when the electric pulse P1 of the bias DC signal is turned on or off. Accordingly, it is possible to increase the density of the plasma at an appropriate timing according to the timing when ions in the plasma are attracted to the substrate W. Further, it is possible to raise the electron temperature in the plasma. Further, in the examples illustrated in FIGS. 17 to 24, at the timing when the electric pulse P1 of the bias DC signal is turned on, it is possible to supply the synthesized wave of the source RF signal to the substrate support 11 at an appropriate timing. Accordingly, it is possible to suppress the reflection of the synthesized wave of the source RF signal at the timing when the electric pulse P1 of the bias DC signal is turned on. In addition, in the examples illustrated in FIGS. 17 to 24, even when the impedance of the synthesized wave of the first, second, and third source RF signals changes, impedance matching may be obtained in any of the first, second, and third source RF signals. Therefore, for example, even when the impedance to the synthesized wave changes at the timing when the electric pulse P1 of the bias DC signal is turned on and the reflection amount of the synthesized wave changes, it is possible to suppress the change amount at an appropriate timing.

Figure 25:
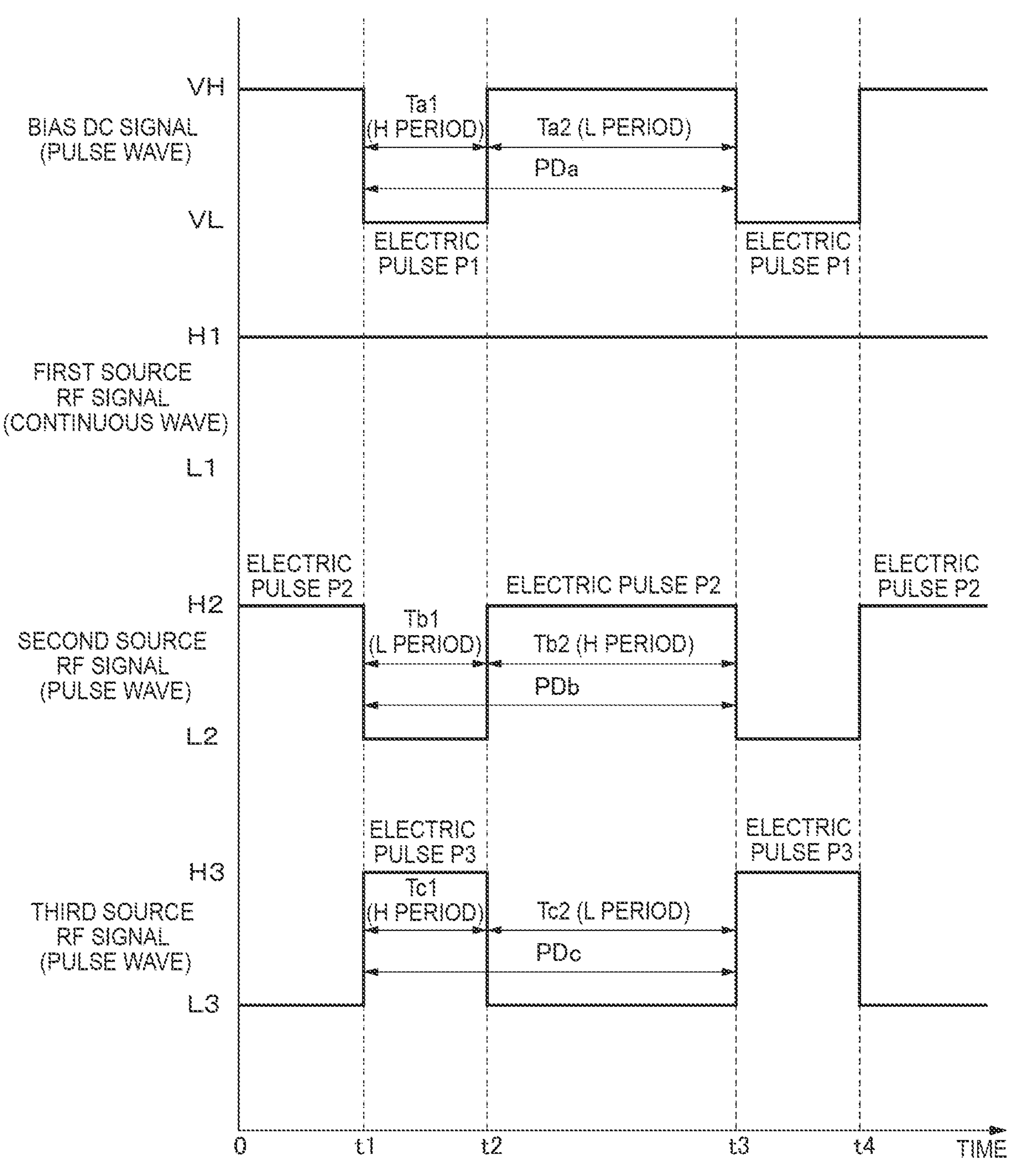
FIG. 25 is a timing chart illustrating still another example of the present processing method.

FIG. 25 is a timing chart illustrating still another example of the present processing method. In the example illustrated in FIG. 25, the electric pulse P2 of the second source RF signal is superimposed on the first source RF signal and supplied to the substrate support 11 in the period Tb2 corresponding to the period Ta2 in which the electric pulse P1 of the bias DC signal is turned off. Further, the electric pulse P3 of the third source RF signal is superimposed on the first source RF signal and supplied to the substrate support 11 in the period Tc1 corresponding to the period Ta1 in which the electric pulse P1 of the bias DC signal is turned off.

In the example illustrated in FIG. 25, the electric pulse P2 of the second source RF signal may be superimposed on the first source RF signal at various timings as illustrated in the examples shown in FIGS. 4 to 15. Further, in the period Tb1 in which the electric pulse P2 of the second source RF signal is turned on, the electric pulse of another RF signal may be further superimposed on the first source RF signal. The frequency or power of each RF signal including the second source RF signal may be arbitrarily set or adjusted according to the purpose.

In the example illustrated in FIG. 25, the electric pulse P3 of the third source RF signal may be superimposed on the first source RF signal at various timings as illustrated in the examples of FIGS. 16 to 24. Further, in a period Tc1 in which the electric pulse P3 of the third source RF signal is turned on, an electric pulse of another RF signal may be further superimposed on the first source RF signal. The frequency and power of each RF signal including the third source RF signal may be arbitrarily set or adjusted according to the purpose.

According to one exemplary embodiment of the present disclosure, it is possible to provide a technology capable of reducing the influence of RF reflection.

The examples described in each of the above drawings may be combined and executed as appropriate. In addition, in the example described in each drawing, the number and frequency of each RF signal superimposed on the first source RF signal may be changed according to the progress of the plasma processing by the present processing method. That is, the synthesized wave supplied to the substrate support 11 may be changed according to the progress of the plasma processing by the present processing method.

For example, when the etching film etched by the present processing method is a multilayer film, the synthesized wave used for etching a predetermined film of the multilayer film may be different from the synthesized wave used for etching another film of the multilayer film. For example, the substrate processing apparatus 1 has a configuration for discriminating the type of the film that has been etched, and the synthesized wave used for the etching process may be changed during the etching process based on the discrimination. Accordingly, it is possible to improve the etching shape and the like by controlling the etching condition according to the type of the etching film. As an example, a configuration for discriminating the type of the film that has been etched may be an optical emission spectroscopy. Further, as an example, the multilayer film may be a film stack of a silicon oxide film and a silicon nitride film.

Further, for example, when etching holes with a high aspect ratio in the etching film using the present processing method, the synthesized wave used in the present processing method may be appropriately changed according to the progress of the etching (depth, time, and the like). Accordingly, it is possible to improve the etching shape or the like by controlling the etching conditions according to the progress of etching. Further, for example, by changing the synthesized wave used in the present processing method according to the progress of etching by the present processing method, the amount of a by-product such as a polymer generated by the etching may be controlled.

Further, in the example described in each drawing, the bias signal is not limited to a rectangular wave. The bias signal may be, for example, a signal such as a trapezoidal wave, a triangular wave, a saw wave, or a sine wave, in which the voltage changes at a certain cycle so that it is possible to apply a predetermined bias voltage to the upper electrode or the substrate support 11. Further, the bias DC signal may be a pulsed RF signal.

Each of the above embodiments is described for the purpose of description, and various modifications may be made without departing from the scope and purpose of the present disclosure. For example, it is possible to execute the present processing method using, in addition to the capacitively coupled substrate processing apparatus 1, a substrate processing apparatus, such as an inductively coupled plasma or a microwave plasma, which uses an arbitrary plasma source. Further, the present disclosure may include, for example, the following configurations.

(Addendum 1)

A plasma processing method for performing plasma processing on a substrate in a plasma processing apparatus including a chamber, and a substrate support that is provided in the chamber and is configured to support the substrate, the plasma processing method including:

disposing a substrate on the substrate support;

supplying, into the chamber, a processing gas for processing the substrate;

generating, in the chamber, a plasma from the processing gas by using a first RF signal and a second RF signal; and supplying a bias signal to the substrate support, in which generating the plasma includes superimposing the second RF signal on the first RF signal based on a timing when the bias signal is supplied to the substrate support.

(Addendum 2)

The plasma processing method according to Addendum 1, in which the bias signal is a pulse wave configured to periodically include a first electric pulse, the first RF signal is an RF continuous wave having a first frequency, the second RF signal is a pulse wave configured to periodically include a second electric pulse, and the second electric pulse is configured to include an RF continuous wave having a second frequency different from the first frequency.

(Addendum 3)

The plasma processing method according to Addendum 2, in which the first electric pulse is configured to include one or more pulse voltages.

(Addendum 4)

The plasma processing method according to Addendum 2, in which the first electric pulse is configured to include an RF continuous wave.

(Addendum 5)

The plasma processing method according to Addendum 2, in which a first cycle, which is a cycle in which the first electric pulse repeatedly appears in the bias signal, is equal to a second cycle, which is a cycle in which the second electric pulse repeatedly appears in the second RF signal.

(Addendum 6)

The plasma processing method according to any one of Addenda 1 to 5, in which, in generating the plasma, the first RF signal and the second RF signal are supplied to the substrate support.

(Addendum 7)

The plasma processing method according to Addendum 2, in which a timing when the second electric pulse appears is equal to a timing when the first electric pulse stops.

(Addendum 8)

The plasma processing method according to Addendum 2, in which a timing when the second electric pulse appears is earlier than a timing when the first electric pulse stops.

(Addendum 9)

The plasma processing method according to Addendum 2, in which a timing when the second electric pulse appears is later than a timing when the first electric pulse stops.

(Addendum 10)

The plasma processing method according to any one of Addenda 7 to 9, in which a period in which the second electric pulse stops in the second cycle is equal to a period in which the first electric pulse appears in the first cycle.

(Addendum 11)

The plasma processing method according to any one of Addenda 7 to 9, in which a period in which the second electric pulse stops in the second cycle is longer than a period in which the first electric pulse appears in the first cycle.

(Addendum 12)

The plasma processing method according to any one of Addenda 7 to 9, in which a period in which the second electric pulse stops in the second cycle is shorter than a period in which the first electric pulse appears in the first cycle.

(Addendum 13)

The plasma processing method according to Addendum 6, in which a timing when the second electric pulse appears is equal to a timing when the first electric pulse appears.

(Addendum 14)

The plasma processing method according to Addendum 6, in which a timing when the second electric pulse appears is earlier than a timing when the first electric pulse appears.

(Addendum 15)

The plasma processing method according to Addendum 6, in which a timing when the second electric pulse appears is later than a timing when the first electric pulse appears.

(Addendum 16)

The plasma processing method according to any one of Addenda 13 to 15, in which a period in which the second electric pulse appears in the second cycle is equal to a period in which the first electric pulse appears in the first cycle.

(Addendum 17)

The plasma processing method according to any one of Addenda 13 to 15, in which a period in which the second electric pulse appears in the second cycle is longer than a period in which the first electric pulse appears in the first cycle.

(Addendum 18)

The plasma processing method according to any one of Addenda 13 to 15, in which a period in which the second electric pulse appears in the second cycle is shorter than a period in which the first electric pulse appears in the first cycle.

(Addendum 19)

The plasma processing method according to any one of Addenda 1 to 6, in which generating the plasma includes further superimposing a third RF signal on the first RF signal based on the timing when the bias signal is supplied to the substrate support.

(Addendum 20)

The plasma processing method according to Addendum 19, in which the third RF signal is a pulse wave configured to periodically include a third electric pulse, the third electric pulse is configured to include an RF having a third frequency which is different from the first frequency and the second frequency, and at least a part of the third electric pulse is superimposed on the first RF signal by being temporally superimposed on the second electric pulse.

(Addendum 21)

The plasma processing method according to Addendum 19, in which the third RF signal is a pulse wave configured to periodically include a third electric pulse, the third electric pulse is configured to include an RF having a third frequency which is different from the first frequency and the second frequency, and the third electric pulse is superimposed on the first RF signal without being temporally superimposed on the second electric pulse.

(Addendum 22)

The plasma processing method according to any one of Addenda 2 to 22, in which the second frequency is an integral multiple of the first frequency.

(Addendum 23)

The plasma processing method according to any one of Addenda 2 to 22, in which the pulse voltage includes a negative voltage.

(Addendum 24)

A plasma processing apparatus including:

a chamber;

a substrate support that is provided in the chamber and is configured to support the substrate;

a controller, in which the controller executes a control of disposing the substrate on the substrate support, supplying, into the chamber, a processing gas for processing the substrate, generating, in the chamber, a plasma of the processing gas by using a first RF signal and a second RF signal, applying a bias signal to the substrate support, and superimposing the second RF signal on the first RF signal based on a timing when the bias signal is applied to the substrate support.

What is claimed is:

1. A plasma processing method for performing plasma processing on a substrate in a plasma processing apparatus including a chamber, and a substrate support that is provided in the chamber and is configured to support the substrate, the plasma processing method comprising:

disposing a substrate on the substrate support;

supplying, into the chamber, a processing gas for processing the substrate;

generating, in the chamber, a plasma from the processing gas by using a first source RF signal and a second source RF signal; and supplying a bias signal to the substrate support, wherein generating the plasma includes superimposing the second source RF signal on the first source RF signal based on a timing when the bias signal is supplied to the substrate support.

2. The plasma processing method according to claim 1, wherein the bias signal is a pulse wave configured to periodically include a first electric pulse, the first source RF signal is an RF sinusoidal wave having a first frequency, the second source RF signal is a pulse wave configured to periodically include a second electric pulse, and the second electric pulse is configured to include an RF sinusoidal wave having a second frequency different from the first frequency.

3. The plasma processing method according to claim 2, wherein the first electric pulse is configured to include one or more pulse voltages.

4. The plasma processing method according to claim 2, wherein the first electric pulse is configured to include an RF sinusoidal wave.

5. The plasma processing method according to claim 2, wherein a first cycle, which is a cycle in which the first electric pulse repeatedly appears in the bias signal, is equal to a second cycle, which is a cycle in which the second electric pulse repeatedly appears in the second RF signal.

6. The plasma processing method according to claim 2, wherein a timing when the second electric pulse appears is equal to a timing when the first electric pulse stops.

7. The plasma processing method according to claim 6, wherein a period in which the second electric pulse stops in the second cycle is equal to a period in which the first electric pulse appears in the first cycle.

8. The plasma processing method according to claim 6, wherein a period in which the second electric pulse stops in the second cycle is longer than a period in which the first electric pulse appears in the first cycle.

9. The plasma processing method according to claim 6, wherein a period in which the second electric pulse stops in the second cycle is shorter than a period in which the first electric pulse appears in the first cycle.

10. The plasma processing method according to claim 2, wherein a timing when the second electric pulse appears is earlier than a timing when the first electric pulse stops.

11. The plasma processing method according to claim 2, wherein a timing when the second electric pulse appears is later than a timing when the first electric pulse stops.

12. The plasma processing method according to claim 2, wherein the second frequency is an integral multiple of the first frequency.

13. The plasma processing method according to claim 2, wherein a pulse voltage includes a negative voltage.

14. The plasma processing method according to claim 1, wherein, in generating the plasma, the first source RF signal and the second source RF signal are supplied to the substrate support.

15. The plasma processing method according to claim 14, wherein a timing when the second electric pulse appears is equal to a timing when the first electric pulse appears.

16. The plasma processing method according to claim 15, wherein a period in which the second electric pulse appears in the second cycle is equal to a period in which the first electric pulse appears in the first cycle.

17. The plasma processing method according to claim 15, wherein a period in which the second electric pulse appears in the second cycle is longer than a period in which the first electric pulse appears in the first cycle.

18. The plasma processing method according to claim 15, wherein a period in which the second electric pulse appears in the second cycle is shorter than a period in which the first electric pulse appears in the first cycle.

19. The plasma processing method according to claim 14, wherein a timing when the second electric pulse appears is earlier than a timing when the first electric pulse appears.

20. The plasma processing method according to claim 14, wherein a timing when the second electric pulse appears is later than a timing when the first electric pulse appears.

21. The plasma processing method according to claim 1, wherein generating the plasma includes further superimposing a third source RF signal on the first source RF signal based on the timing when the bias signal is supplied to the substrate support.

22. The plasma processing method according to claim 21, wherein the third source RF signal is a pulse wave configured to periodically include a third electric pulse, the third electric pulse is configured to include an RF wave having a third frequency which is different from the first frequency and the second frequency, and at least a part of the third electric pulse is superimposed on the first source RF signal by being temporally superimposed on the second electric pulse.

23. The plasma processing method according to claim 21, wherein the third source RF signal is a pulse wave configured to periodically include a third electric pulse, the third electric pulse is configured to include an RF wave having a third frequency which is different from the first frequency and the second frequency, and the third electric pulse is superimposed on the first source RF signal without being temporally superimposed on the second electric pulse.

24. A plasma processing apparatus comprising:

a chamber;

a substrate support that is provided in the chamber and is configured to support a substrate; and a controller, wherein the controller executes a control of disposing the substrate on the substrate support, supplying, into the chamber, a processing gas for processing the substrate, generating, in the chamber, a plasma of the processing gas by using a first source RF signal and a second source RF signal, applying a bias signal to the substrate support, and superimposing the second source RF signal on the first source RF signal based on a timing when the bias signal is applied to the substrate support.

* * * * *